(12) United States Patent
Lee et al.

(10) Patent No.: US 12,701,955 B2
(45) Date of Patent: Aug. 4, 2026

(54) INSPECTION APPARATUS FOR SEMICONDUCTOR DEVICE

(71) Applicant: SAMSUNG ELECTRONICS CO., LTD., Suwon-si (KR)

(72) Inventors: Jubok Lee, Suwon-si (KR); Soonyang Kwon, Suwon-si (KR); Kwangrak Kim, Suwon-si (KR); Jangryul Park, Suwon-si (KR); Jonghyeok Park, Suwon-si (KR); Heesu Chung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 6 days.

(21) Appl. No.: 19/054,433

(22) Filed: Feb. 14, 2025

(65) Prior Publication Data

US 2025/0285895 A1 Sep. 11, 2025

(30) Foreign Application Priority Data

Mar. 6, 2024 (KR) ........................ 10-2024-0031922

(51) Int. Cl.
*H10P 72/00* (2026.01)
*G01N 21/21* (2006.01)
*G01N 21/95* (2006.01)

(52) U.S. Cl.
CPC ......... *H10P 72/0616* (2026.01); *G01N 21/21* (2013.01); *G01N 21/9501* (2013.01)

(58) Field of Classification Search
CPC ... H10P 72/0616; H10P 74/203; G01N 21/21; G01N 21/211; G01N 21/9501; G01N 21/956; G01N 21/95607; G01N 2021/8848; G01N 23/2251; G01N 23/20008; G01N 2223/401; G01N 2223/418;

(Continued)

(56) References Cited

U.S. PATENT DOCUMENTS 5,322,590 A 6/1994 Koshimizu
6,768,543 B1 * 7/2004 Aiyer ................... G01N 21/956
356/237.4

(Continued)

FOREIGN PATENT DOCUMENTS

KR 10-1275943 B1 6/2013
KR 10-2086362 B1 3/2020

(Continued)

*Primary Examiner* — Nasim N Nirjhar
(74) *Attorney, Agent, or Firm* — Sughrue Mion, PLLC

(57) ABSTRACT

Provided is an inspecting apparatus for semiconductor device including a chamber, a substrate stage within the chamber and configured to load a test wafer, the test wafer including a plurality of wiring layers, a milling device configured to partially remove the test wafer, and a measuring device including a body portion, a light source configured to irradiate an incident light, an objective lens, a lens assembly having a plurality of optical filter and an optical splitter, wherein the lens assembly is configured to introduce the incident light such that the incident light is emitted on the test wafer; and a polarization camera configured to scan the test wafer by receiving reflected light reflected from the test wafer, wherein the measuring device is configured to measure polarization characteristic of the reflected light and uniformity of the test wafer.

20 Claims, 22 Drawing Sheets

10

(58) Field of Classification Search
    CPC ... G01N 2223/6116; G01N 2223/6462; G02B
                                27/0172; H01J 37/3053
    See application file for complete search history.

(56)                    References Cited

U.S. PATENT DOCUMENTS

| | | | |
|---|---|---|---|
| 9,322,771 B2 | 4/2016 | Son et al. | |
| 9,551,653 B2 | 1/2017 | Son et al. | |
| 2016/0011122 A1* | 1/2016 | Pacheco | G01N 21/9505 |
| | | | 356/369 |
| 2018/0103247 A1* | 4/2018 | Kolchin | H04N 13/254 |
| 2021/0219847 A1 | 7/2021 | Bernat et al. | |
| 2024/0055282 A1* | 2/2024 | Yang | H10P 72/0604 |
| 2024/0096713 A1 | 3/2024 | Zhang et al. | |

FOREIGN PATENT DOCUMENTS

| | | | |
|---|---|---|---|
| WO | 2019/220438 A1 | 11/2019 | |
| WO | 2022/132704 A1 | 6/2022 | |

* cited by examiner

F I G. 19A
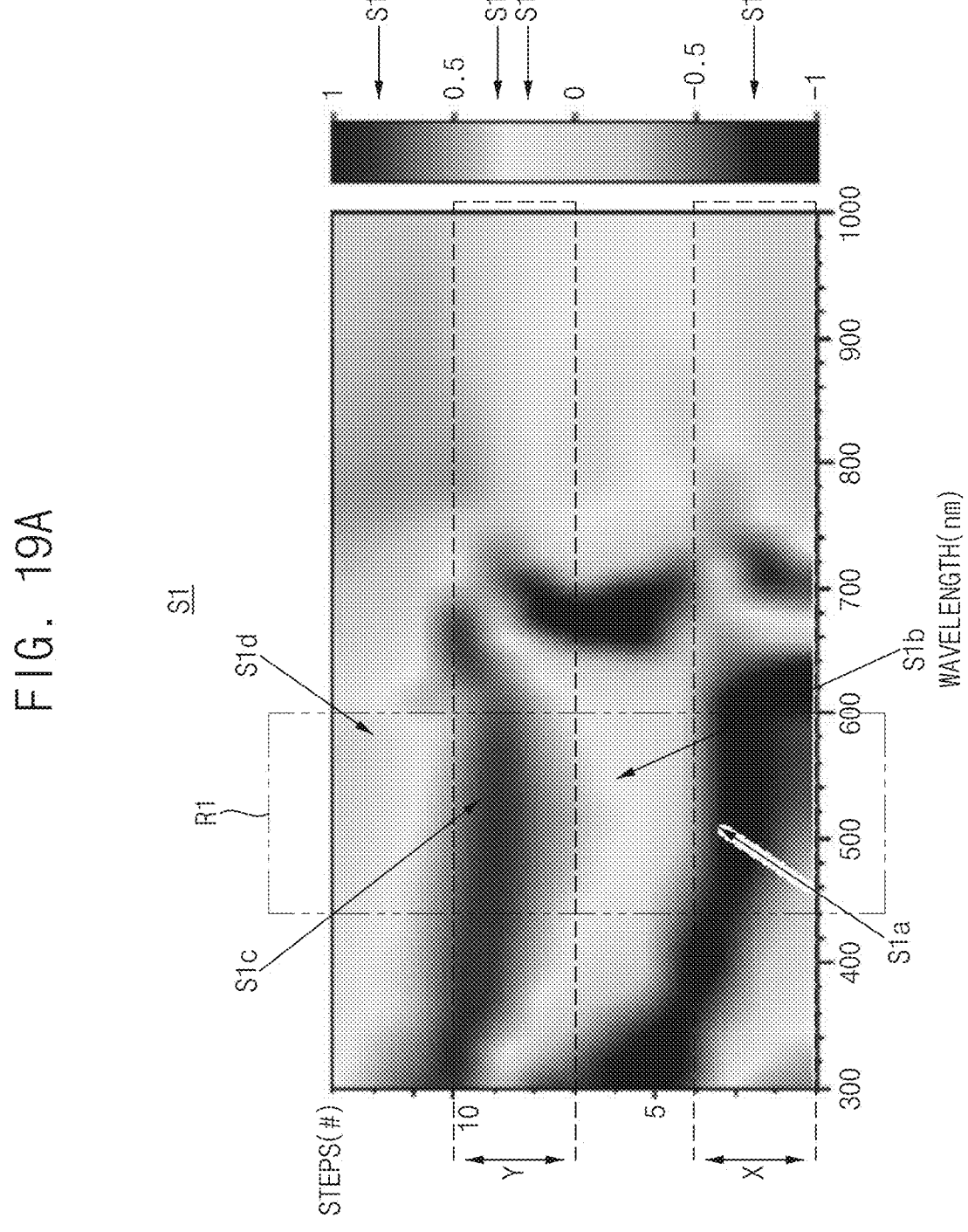

F I G. 20B
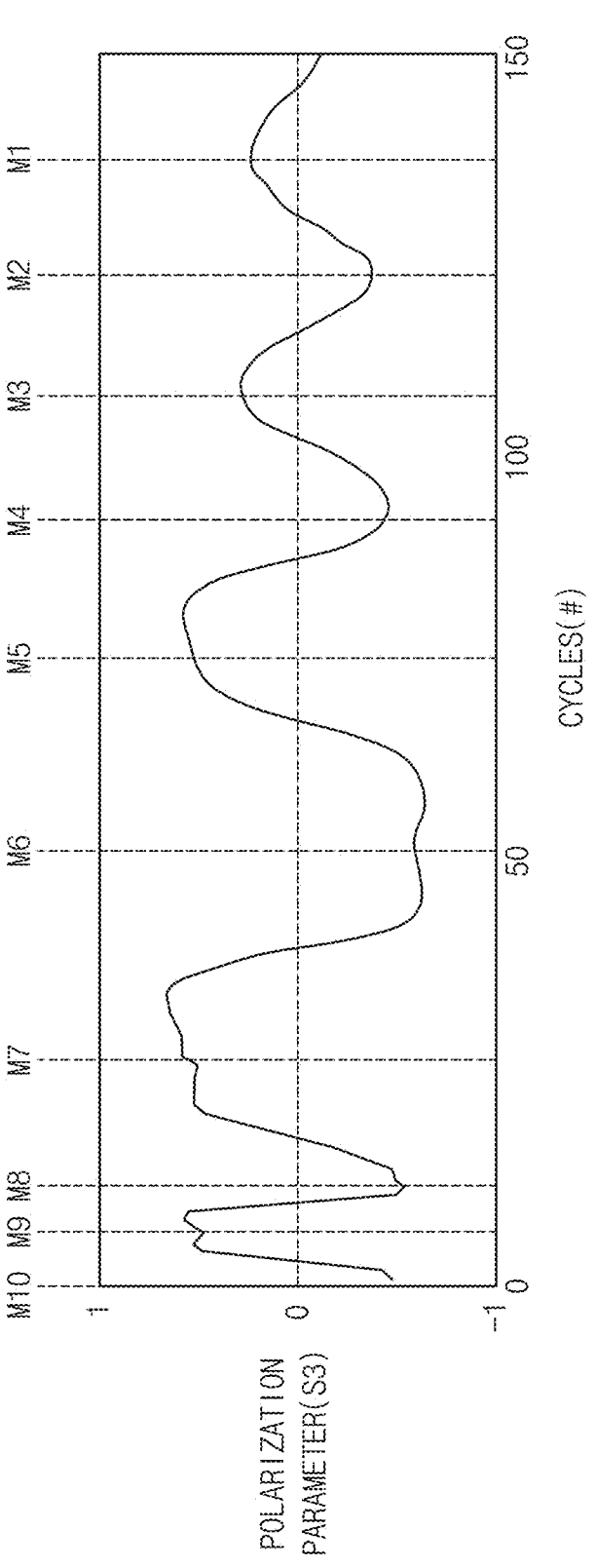

INSPECTION APPARATUS FOR SEMICONDUCTOR DEVICE

PRIORITY STATEMENT

This application claims priority to Korean Patent Application No. 10-2024-0031922, filed on Mar. 6, 2024, in the Korean Intellectual Property Office, the disclosure of which is incorporated herein in its entirety by reference.

BACKGROUND

1. Field

Embodiments of the present disclosure relate to an inspecting apparatus for semiconductor device. More particularly, embodiments of the present disclosure relate to an inspecting apparatus for semiconductor device configured to partially remove a semiconductor device by irradiating a light.

2. Description of the Related Art

When a defect occurs in a semiconductor device comprising a plurality of wiring layers, it may be necessary to accurately determine information about the defective wiring layer where the defect occurred by removing upper wiring layers disposed on the defective wiring layer. However, related methods such as optical emission spectroscopy (OES) and secondary-ion mass spectrometry (SIMS) may have a problem that it is difficult to identify horizontal information of a wiring layer. In addition, conventional ion-beam milling devices may have difficulty in determining an end point, which results in a relatively long period of process time being consumed. Further, since the related methods cannot provide feedback on the uniformity of uniformly removing wiring layers by reflecting horizontal information in real time, there is a problem of providing horizontal information for different wiring layers.

SUMMARY

One or more embodiments provide an inspecting apparatus for semiconductor device configured to measure the uniformity and an end point of a milling process in real time.

According to an aspect of one or more embodiments, there is provided an inspecting apparatus for semiconductor device including a chamber including a passing region configured to transmit light, a substrate stage included in the chamber and including a seated surface configured to load a test wafer, the test wafer including a plurality of wiring layers respectively including a plurality of metal lines, a milling device configured to emit an ion-beam on the plurality of wiring layers included in the test wafer to partially remove the test wafer, and a measuring device including a body portion on the passing region and including a first end portion facing the passing region, a light source on a side portion of the body portion and configured to emit incident light, an objective lens provided on the first end portion of the body portion, a lens assembly including a plurality of optical filters and an optical splitter, the lens assembly being configured to introduce the incident light such that the incident light passes through the objective lens and the passing region and is emitted on the test wafer, and a polarization camera configured to scan the test wafer based on receiving reflected light reflected from the test wafer, wherein the measuring device is configured to measure a polarization characteristic of the reflected light and uniformity of the test wafer.

According to another aspect of one or more embodiments, there is provided an inspecting apparatus for semiconductor device including a chamber an inner space formed by an upper wall including a passing region configured to transmit light, a lower wall facing the upper wall, and a plurality of side walls between the upper wall and the lower wall, a substrate stage included in the inner space and including a seated surface configured to load a test wafer, the test wafer including a plurality of wiring layers respectively including a plurality of metal lines, a milling device on a portion of the plurality of side walls included in the chamber and configured to emit an ion-beam on the plurality of wiring layers included in the test wafer to partially remove the plurality of wiring layers, and a polarization camera on the passing region and configured to scan the test wafer, a light source configured to emit incident light to scan the plurality of metal wirings included in the test wafer, an objective lens between the polarization camera and the light source, and facing the passing region, a lens assembly between the polarization camera and the objective lens and configured to introduce the incident light such that the incident light passes through the objective lens and the passing region and is emitted on the test wafer, and at least one processor configured to obtain uniformity data of the test wafer and polarization characteristic data of reflected light reflected by the test wafer from the polarization camera.

According to still another aspect of one or more embodiments, there is provided an inspecting apparatus for semiconductor device including a chamber including a passing region and configured to be irradiated by light, a substrate stage included in the chamber and including a seated surface configured to load a test wafer, the test wafer including a plurality of wiring layers respectively including a plurality of first metal lines extending in a first direction and a plurality of second metal lines extending in a second direction perpendicular to the first direction, a milling device configured to emit an ion-beam on the plurality of wiring layers to partially remove the plurality of wiring layers, a measuring device on the passing region and configured to emit incident light on the test wafer which is etched by the ion-beam and measure a polarization characteristic of reflected light reflected from the test wafer, and at least one processor configured to detect an end point of a milling process from the measured polarization characteristic and stop an operation of the milling device at the end point, wherein a first polarization component of the incident light parallel with the first direction is reflected from the plurality of first metal lines, and a second polarization component of incident light perpendicular to the first direction is reflected from the plurality of second metal lines, and wherein the measuring device is configured to detect a difference of vibration direction between the first polarization component and the second polarization component and a difference of phase between the first polarization component and the second polarization component.

BRIEF DESCRIPTION OF DRAWINGS

The above and other aspects and features of the present disclosure will become more apparent by describing in detail exemplary embodiments thereof with reference to the attached drawings, in which:

Figure 13:
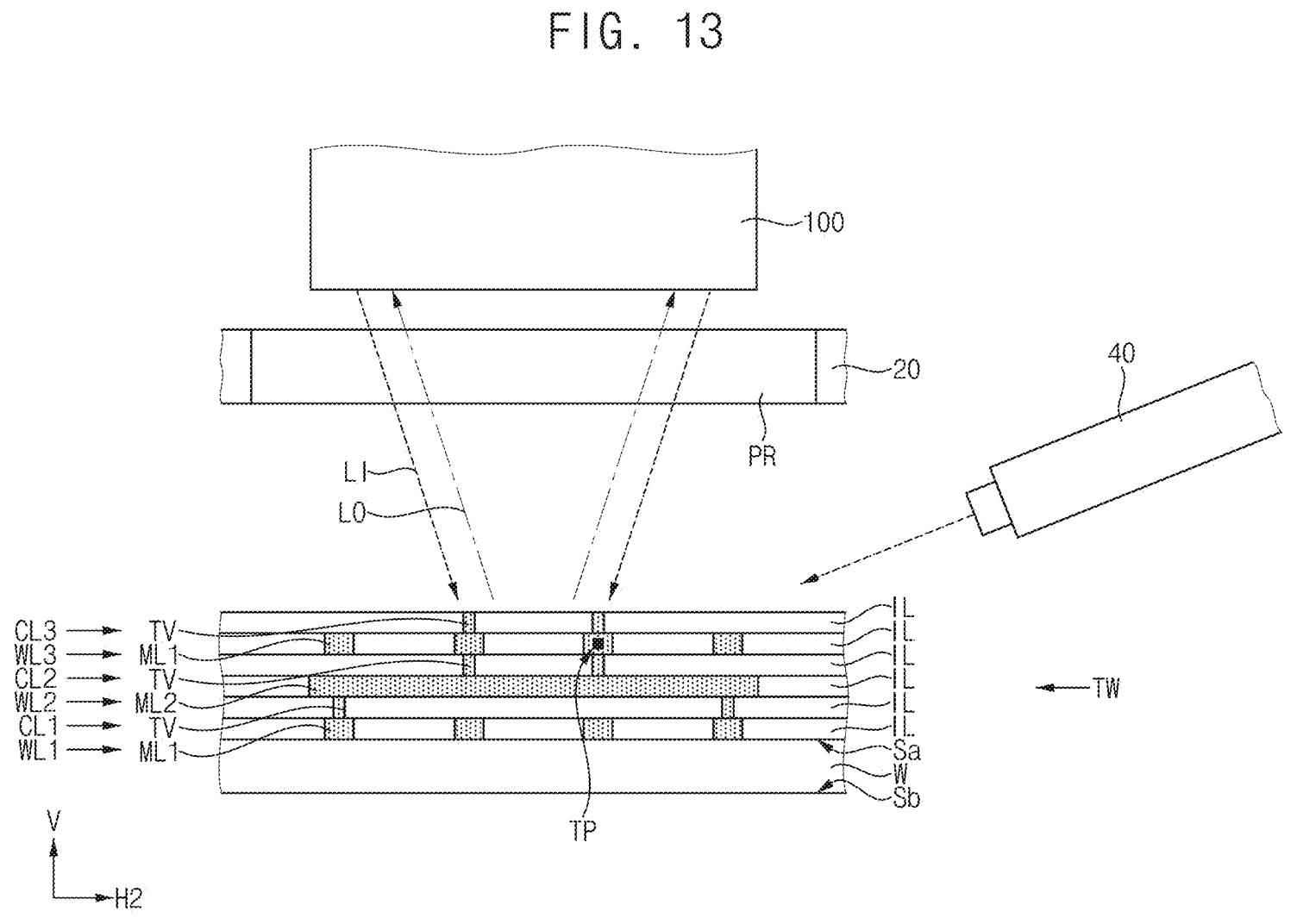

FIGS. 13 and 14 are views illustrating an insulation layer being measured with the measuring device of FIG. 4 in accordance with one or more embodiments;

FIGS. 15 and 16 are views illustrating a wiring layer including a plurality of first metal lines being measured with the measuring device of FIG. 4;

FIG. 19A is a simulation graph illustrating a change of a second polarization variable according to the etching simulation of FIG. 18;

FIG. 20B is an experimental graph illustrating a value of the fourth polarization variable changing periodically relative to the specific location in the experimental graph of FIG. 20A.

DETAILED DESCRIPTION

Hereinafter, one or more embodiments will be explained in detail with reference to the accompanying drawings.

It will be understood that, although the terms first, second, third, fourth, etc. may be used herein to describe various elements, components, regions, layers and/or sections (collectively "elements"), these elements should not be limited by these terms. These terms are only used to distinguish one element from another element. Thus, a first element described in this description section may be termed a second element or vice versa in the claim section without departing from the teachings of the disclosure.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

As used herein, an expression "at least one of" preceding a list of elements modifies the entire list of the elements and does not modify the individual elements of the list. For example, an expression, "at least one of a, b, and c" should be understood as including only a, only b, only c, both a and b, both a and c, both b and c, or all of a, b, and c.

Figure 1:
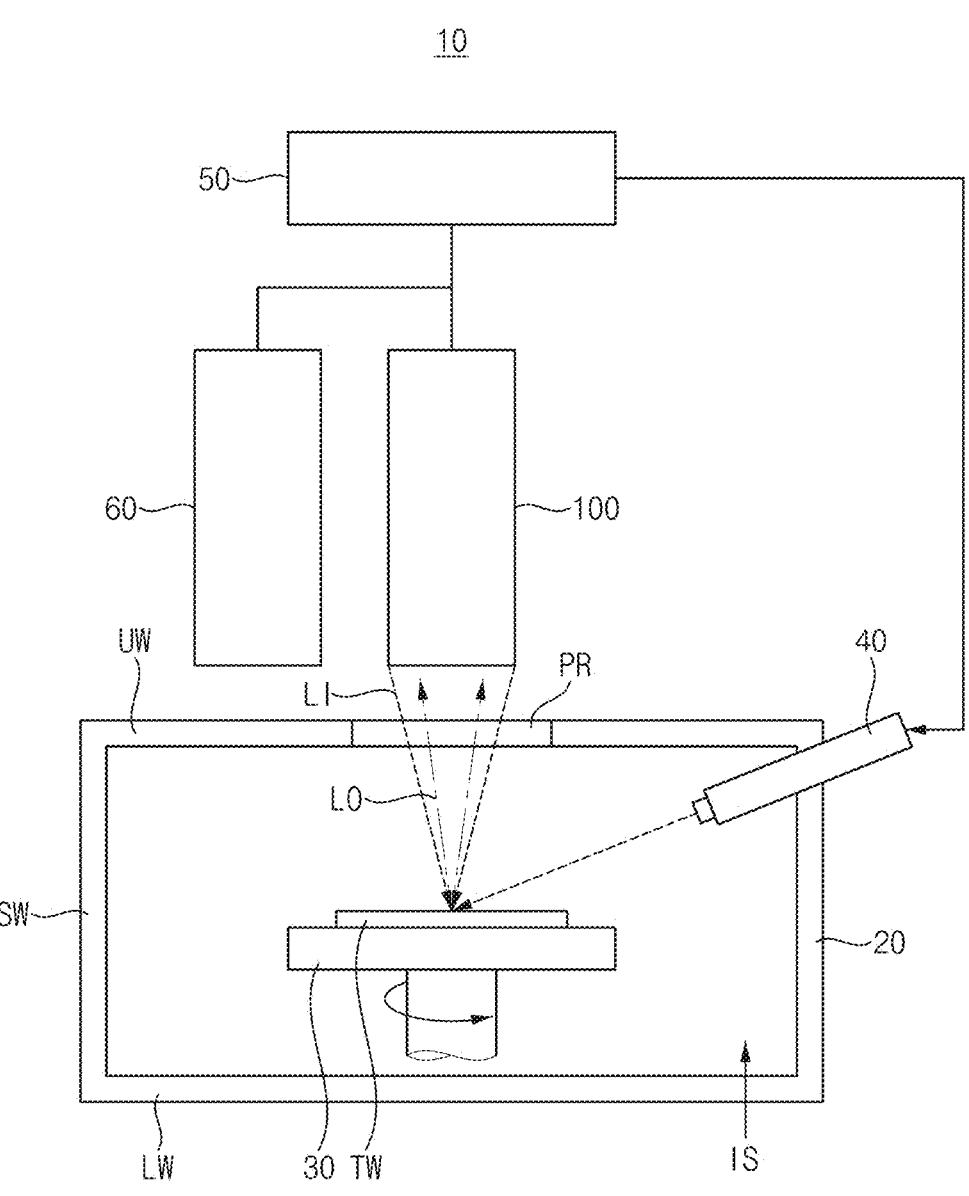
FIG. 1 is a cross-sectional view illustrating an inspecting apparatus for semiconductor device in accordance with one or more embodiments.
Figure 2:
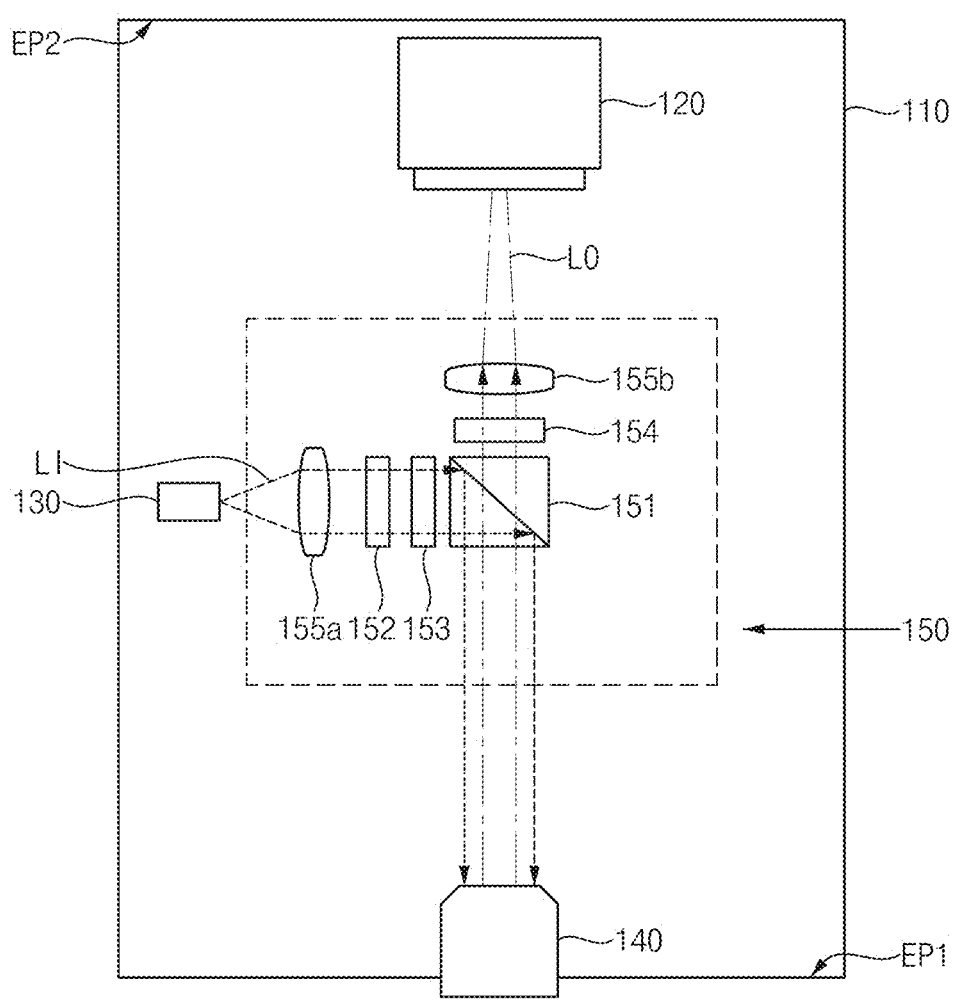
FIG. 2 is a cross-sectional view illustrating the inspecting apparatus in FIG. 1.

FIG. 1 is a cross-sectional view illustrating an inspecting apparatus for semiconductor device in accordance with one or more embodiments. FIG. 2 is a cross-sectional view illustrating the inspecting apparatus in FIG. 1.

Referring to FIGS. 1 and 2, an inspecting apparatus for semiconductor device may include a chamber 20, a substrate stage 30 provided in the chamber 20, a milling device 40 configured to partially remove a test wafer TW which is supported on the substrate stage 30, a measuring device 100 configured to measure a wiring layer of the test wafer TW, and a controller 50 configured to control the milling device 40 based on data measured from the measuring device 100. In addition, the inspecting apparatus 10 for semiconductor device may further include an image measuring device configured to scan the test wafer TW. For example, the image measuring device may include a scanning electron microscope (SEM) or a transmission electron microscope (TEM).

The test wafer may include a device layer in which a plurality of electronic elements is formed and a plurality of wiring layers electrically connected to the plurality of electronic elements. For example, the plurality of electronic elements may include a plurality of transistors. The wiring layer may respectively include a plurality of metal lines formed by a back end of line (BEOL) process and an insulation layer provided on and covering the plurality of metal lines. Further, the plurality of metal lines in each of the plurality of wiring layers may be connected by a plurality of vias. For example, the plurality of metal lines and the plurality of vias may include a conductive material such as, for example, aluminum (Al), copper (Cu), etc.

The plurality of metal lines may include a plurality of first metal lines extending in a first direction and a plurality of second metal lines extending in a second direction perpendicular to the first direction. The plurality of first metal lines and the plurality of second metal lines may be alternately stacked on the device layer. Further, a plurality of vias may be provided between the plurality of first metal lines and the plurality of second metal lines.

The inspecting apparatus for semiconductor device may be an apparatus configured to identify a defect in the plurality of wiring layers of the test wafer when the defect occurs inside the plurality of wiring layers. For example, the inspecting apparatus for semiconductor device may be an apparatus configured to remove upper wiring layers provided on the defective portion and capture a horizontal image of the defective portion. Defects in the test wafer may be detected through an inspection step, such as, for example, an electrical inspection.

In one or more embodiments, the chamber 20 may include an upper wall UW having a passing region PR through which light passes, a lower wall LW facing the upper wall UW, and a plurality of side walls SW extending between the upper wall UW and the lower wall LW. Additionally, the chamber may include an inner space IS defined by the upper wall, the lower wall, and the plurality of side walls.

In one or more embodiments, the substrate stage 30 may be provided in the inner space IS of the chamber PS and include a seating surface on which the test wafer TW is loaded. For example, the substrate stage may be located below the passing region of the chamber such that light passing through the passing region is irradiated (emitted) onto the test wafer TW loaded on the substrate stage. Further, the substrate stage 30 may be rotated at a desired speed by a drive portion.

In one or more embodiments, the milling device 40 may be provided on a portion of the chamber 20 such that the milling device 40 faces the test wafer TW loaded on the substrate stage 30. For example, the milling device 40 may be provided on a portion of the plurality of side walls SW of the chamber. The milling device 40 may be an ion beam milling device configured to irradiate (emit) accelerated ions onto a sample to partially remove the sample. For example, the ions may include ions of an inert gas such as argon (Ar).

The milling device 40 may uniformly etch the test wafer TW by rotating the test wafer TW at a constant speed by the substrate stage 30.

In one or more embodiments, the controller 50 may obtain uniformity data and polarization characteristic data of the etched test wafer TW by receiving measuring data from the measuring device, which will be described later. The controller 50 may control the milling device 40 by reflecting the uniformity data and the polarization characteristic data. For example, the controller 50 may obtain the uniformity data by analyzing uniformity of the etched surface of the test wafer TW. The controller 50 may adjust the intensity distribution of the ion beam irradiated (emitted) by the milling device 40 to reflect the uniformity of the etched surface of the test wafer TW. Further, the controller 50 may detect an end point of the milling process by analyzing the polarization characteristic data. The controller 50 may stop an operation of the milling device 40 by reflecting the end point.

For example, the polarization characteristic may be a relationship between intensities of a plurality of polarization components of a light. The plurality of polarization components may include a plurality of linear polarization components whose direction of oscillation is constant over time and a plurality of circular polarization components whose direction of oscillation varies over time.

In one or more embodiments, the measuring device 100 may include a body 110 provided above the passing region PR and facing the pass region PR, a polarization camera 120 provided in a space adjacent to a second end portion EP2 of the body 110 and configured to scan the test wafer TW, a light source 130 provided at a side portion of the body 110 and configured to irradiate light, an objective lens 140 provided at a first end portion EP1 opposite to the second end portion EP2, and a lens assembly 150 provided between the polarization camera 120 and the objective lens 140. For example, the measuring device may be a device configured to scan an etched surface of a test wafer TW in situ during an etching process using the milling device 40 to measure the uniformity of the etched surface and the polarization characteristics of reflected light reflected from the etched surface.

The polarization camera 120 may be overlapped with the test wafer TW and adjacent to the second end portion EP2 of the body 110. The polarization camera 120 may be a device configured to scan the etched surface of the test wafer TW. The polarization camera 120 may scan a horizontal image of the etched surface in a snapshot manner, in which the etched surface is scanned, during the etching process by the milling device 40. For example, the polarization camera 120 may periodically scan the etched surface according to a rotation cycle of the substrate stage 30. For example, the polarization camera 120 may scan the etched surface at each time when the test wafer is located in place after one rotation. The scanning period of the polarization camera may be within a range of 100 us to 5 ms.

The polarization camera 120 may include a plurality of polarization filters. For example, the plurality of polarization filters may be configured to selectively pass a specific light among a unpolarized and natural light. The specific light may vibrate in a particular direction. The plurality of polarization filters may be filters that have 0 degrees, 45 degrees, 90 degrees, or 135 degrees with respect to a particular direction in a XY plane.

The light source 130 may be configured to generate an incident light LI in order to irradiate (emit) the test wafer TW loaded on the substrate stage 30. For example, the incident light may be generated by the light source 130 and irradiated (emitted) onto the test wafer TW from the measuring device 100. Subsequently, the incident light may be reflected by the test wafer TW and converted to a reflected light LO. The reflected light may then be returned back to the measuring device 100 and introduced into the polarization camera 120.

The objective lens 140 may be provided on the first end portion EP1 adjacent to the test wafer TW in the body 110 of the measuring device 100. The objective lens 140 may be provided between the polarization camera 120 and the test wafer TW to be aligned with the polarization camera 120 and the test wafer TW. For example, the objective lens may be a lens provided adjacent to an object to be observed and configured to adjust light reflected from the object to make a magnified image.

The lens assembly 150 may include an optical splitter 151 provided in a center portion of the body 110, a first optical filter 152 and a second optical filter 153 sequentially provided between the optical splitter 151 and the light source 130, and a wave plate 154 provided between the optical splitter 151 and the polarization camera 120. In addition, the lens assembly 150 may further include a plurality of secondary lenses 155. For example, the plurality of secondary lenses 155 may include a first secondary lens 155a provided between the first optical filter 152 and the light source 130 and a second secondary lens 155b provided between the wave plate 154 and the polarization camera 120.

The optical splitter 151 may change a path of the incident light LI so that the incident light LI passes through the objective lens 140 and the passing region PR of the chamber 20 to be irradiated (emitted) onto the test wafer TW. Further, the optical splitter 151 may pass the reflected light LO reflected by the test wafer TW such that the reflected light LO is introduced into the polarization camera 120.

The first optical filter 152 may be provided between the optical splitter 151 and the light source 130 and configured to selectively pass a specific light among the incident light LI, wherein the specific light has a wavelength within a specific wavelength range. For example, the first optical filter 152 may be a band pass filter.

The second optical filter 153 may be provided between the optical splitter 151 and the light source 130 and configured to selectively pass a specific among the incident light LI, wherein the specific light oscillates in a certain direction. For example, the second optical filter may be a linear polarizer filter.

The wave plate 154 may be provided between the optical splitter 151 and the polarization camera 120 to selectively delay the phase of certain components among polarization components of the reflected light LO. For example, the wave plate may be a quarter-wave plate (QWP). The quarter-wave plate is a phase delay plate configured to selectively delay a phase of a specific polarization component of light passing through the quarter-wave plate by 0.25 times of a wavelength of the light. For example, the light may propagate in a first direction and the specific polarization component may vibrate in a specific direction on a plane parallel to a second direction perpendicular to the first direction.

Hereinafter, paths of the incident light LI and the reflected light LO and polarization characteristics of the reflected light LO are described.

The incident light LI may be generated from the light source 130 and be guided to the objective lens 140 through the lens assembly 150. For example, the incident light LI may pass through the first light filter 152 and the second light filter 153, and then be rerouted by the optical splitter 151 such that the incident light LI is introduced to the objective 140.

The incident light LI may pass through the objective lens 140 and the passing region PR of the chamber 20 to be irradiated (emitted) onto the test wafer TW. The incident light LI may be reflected by the plurality of wiring layers provided on the test wafer TW. In this case, the polarization characteristic of the incident light LI may be changed according to an extension direction of the plurality of metal lines which is provided in the wiring layer.

For example, when an uppermost wiring layer of the plurality of wiring layers includes a plurality of first metal lines ML1, a first polarization component of the incident light LI parallel to the first direction may be reflected, and a second polarization component of the incident light LI perpendicular to the first direction may be transmitted. The second polarization component may be reflected by a lower wiring layer which includes a plurality of second metal lines and is adjacent to the uppermost wiring layer. Thus, the second polarization component and the first polarization component may have differences in the vibration direction and phase. The plurality of wiring layers may be stacked sequentially to alternately include a plurality of first metal lines ML1 and a plurality of second metal lines ML2, and thus the difference in the vibration direction and the phase may change periodically according to the extension direction of the plurality of metal lines.

The reflected light LO reflected by the plurality of wiring layers may be recovered back to the measuring device 100. The reflected light LO may be introduced into the polarization camera 120 via the objective lens 140, the optical splitter 151 and the wave plate 154. The wave plate 154 may induce a time delay between polarization components to assist in determining a circular polarization component of the reflected light LO through the polarization camera 120. The polarization camera 120 of the measuring device 100 may measure an horizontal image of an etched surface and a polarization characteristic of the reflected light from the reflected light. The polarization characteristic may include a difference in the vibration direction and the phase.

The controller 50 may determine the uniformity of the etched surface from the horizontal image of the etched surface measured from the polarization camera 120. Further, the controller 50 may determine a change in the polarization characteristics of the reflected light from the polarization camera 120.

As described above, the inspecting apparatus 10 for semiconductor device may include the chamber 20, the substrate stage 30 provided in the chamber 20, the milling device 40 configured to partially remove the test wafer TW which is loaded on the substrate stage 30, a measuring device 100 configured to measure the plurality of wiring layers of the test wafer TW, and the controller 50 configured to control the milling device 40 based on measured data from the measuring device 100. In addition, the inspecting apparatus 10 for semiconductor device may further include an image measuring device 60 configured to scan the test wafer TW.

The measuring device 100 may include the light source 130 configured to irradiate (emit) the incident light LI, the lens assembly 150 configured to introduce the incident light LI to be irradiated (emitted) on the plurality of wiring layers of the test wafer TW, and the polarization camera 120 configured to receive the reflected light LO reflected from the plurality of wiring layers of the test wafer TW and scan the horizontal image of the plurality of wiring layers of the test wafer TW. The polarization camera 120 may be configured to measure the uniformity of the wiring layer, which is etched, from the horizontal image during the etching process, and may be configured to measure the polarization characteristics of the reflected light LO reflected from the wiring layer. Furthermore, the controller 50 may control the intensity distribution of the ion beam, which is irradiated (emitted) by the milling device 40, by reflecting the uniformity. The controller 50 may detect the end point of the etching process from the polarization characteristics and stop the etching process at the end point.

Accordingly, the inspecting apparatus for semiconductor device may obtain the horizontal image data of the wiring layer. Furthermore, the inspecting apparatus for semiconductor device may etch the wiring layer uniformly by reflecting the horizontal image data. Furthermore, the inspecting apparatus for semiconductor device may detect the end point of the etching process to reduce the process time.

Hereinafter, a method of inspecting a semiconductor device using an inspecting apparatus 10 in accordance with one or more embodiments will be described.

Figure 3:
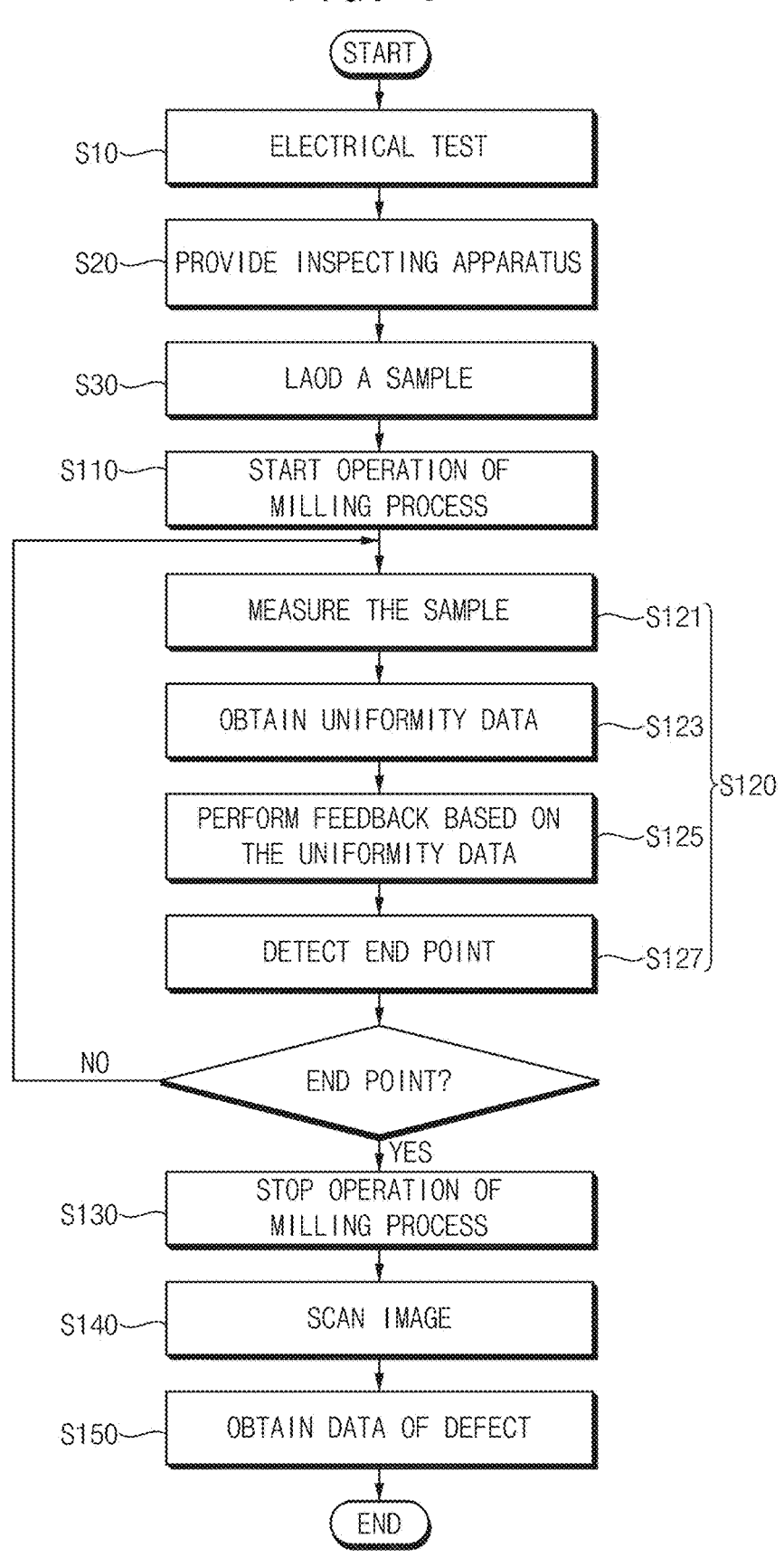
FIG. 3 is a flow diagram illustrating a method of inspecting a semiconductor device in accordance with one or more embodiments.
Figure 4:
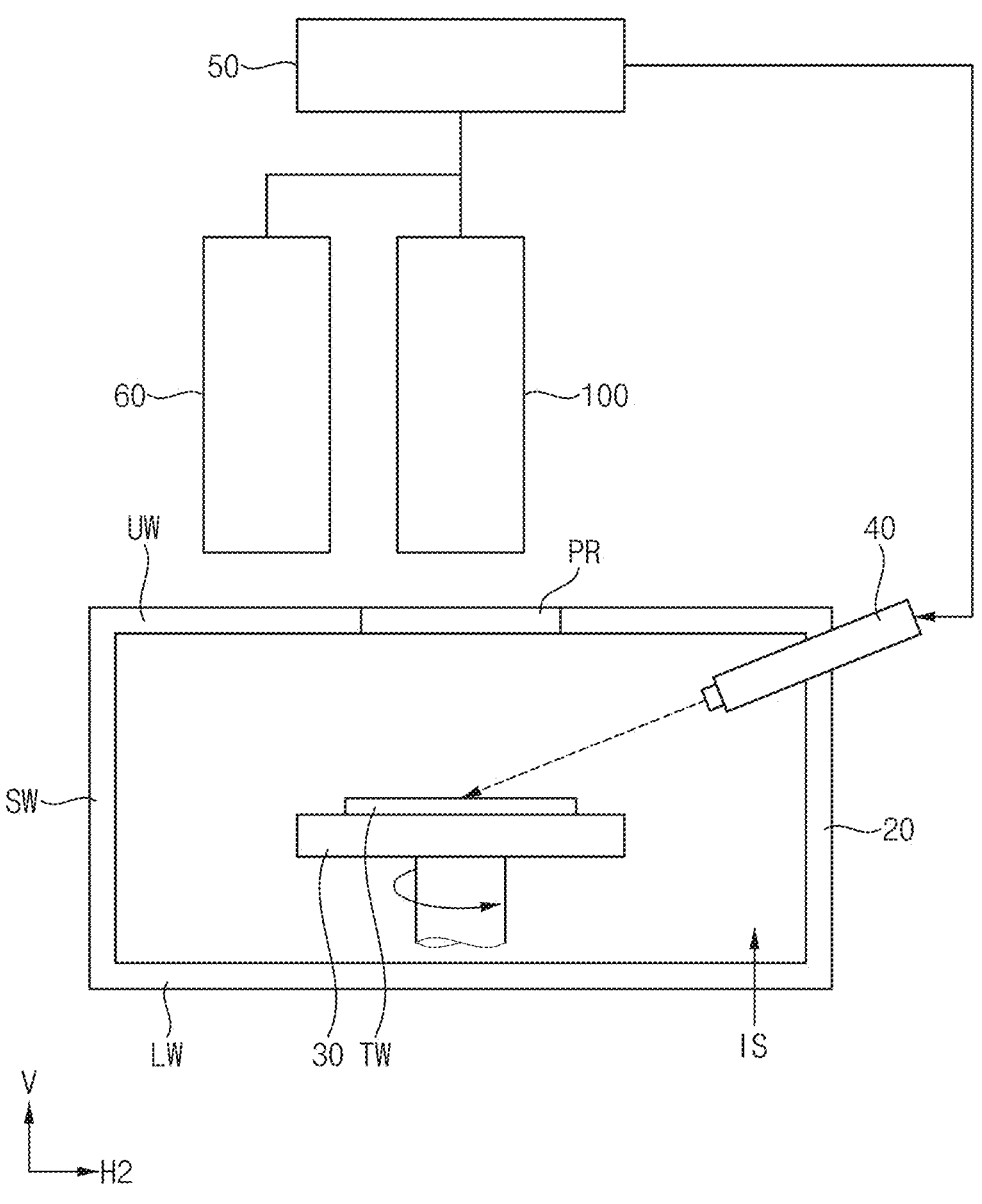
FIG. 4 is a view illustrating a test wafer being etched in accordance with one or more embodiments.
Figure 5:
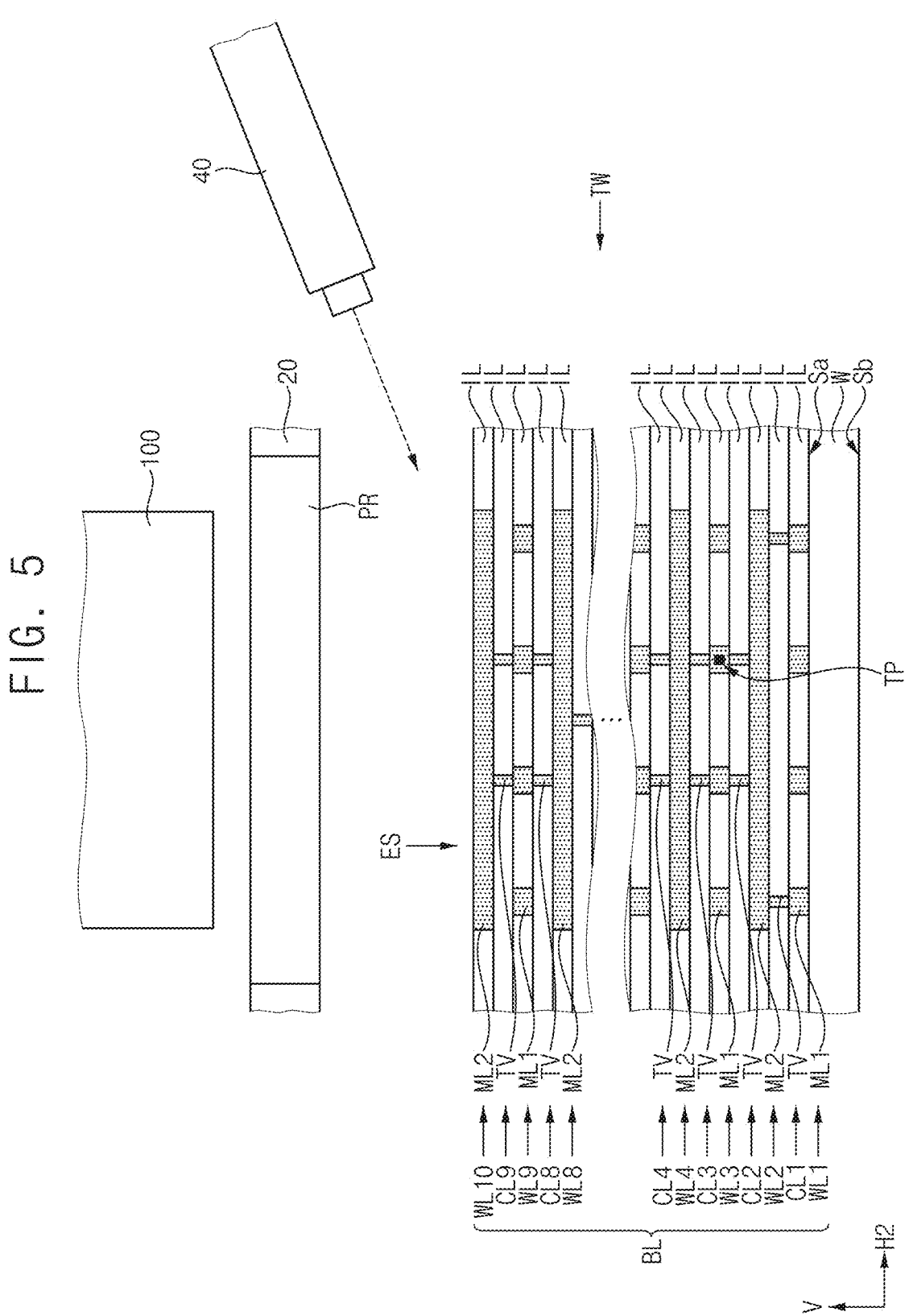
FIG. 5 is an enlarged cross-sectional view illustrating the test wafer of FIG. 4.
Figure 6:
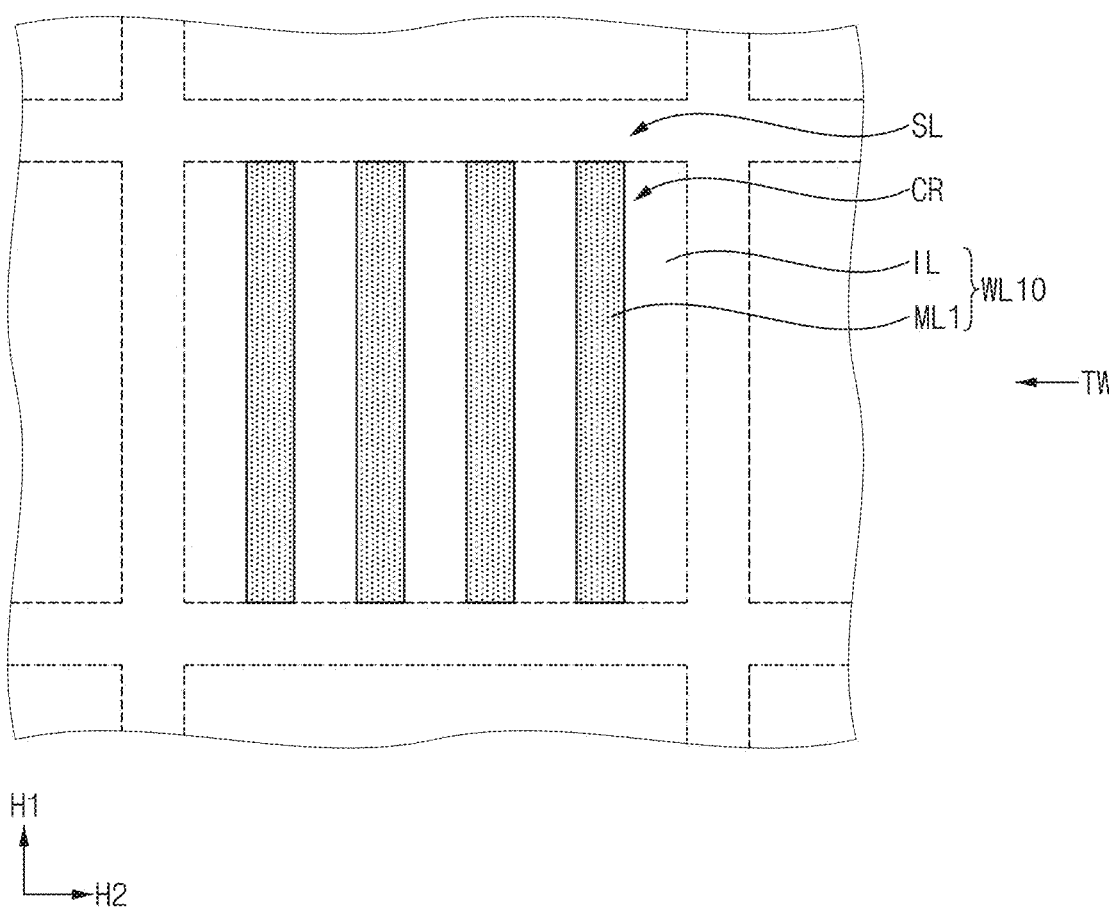
FIG. 6 is a plan view illustrating a wiring layer of the test wafer of FIG. 4.
Figure 7:
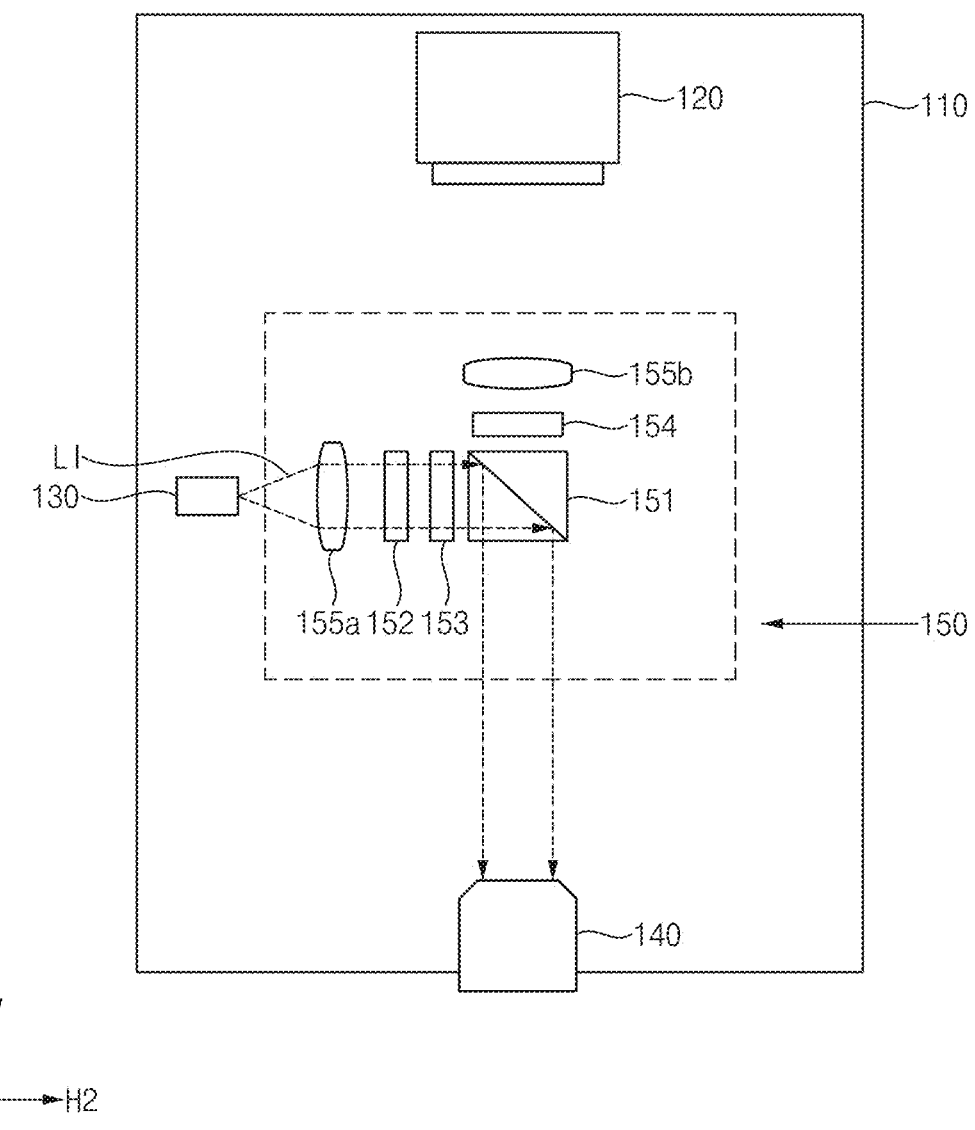
FIG. 7 is a view illustrating light being emitted from a light source in the measuring device of FIG. 4.
Figure 8:
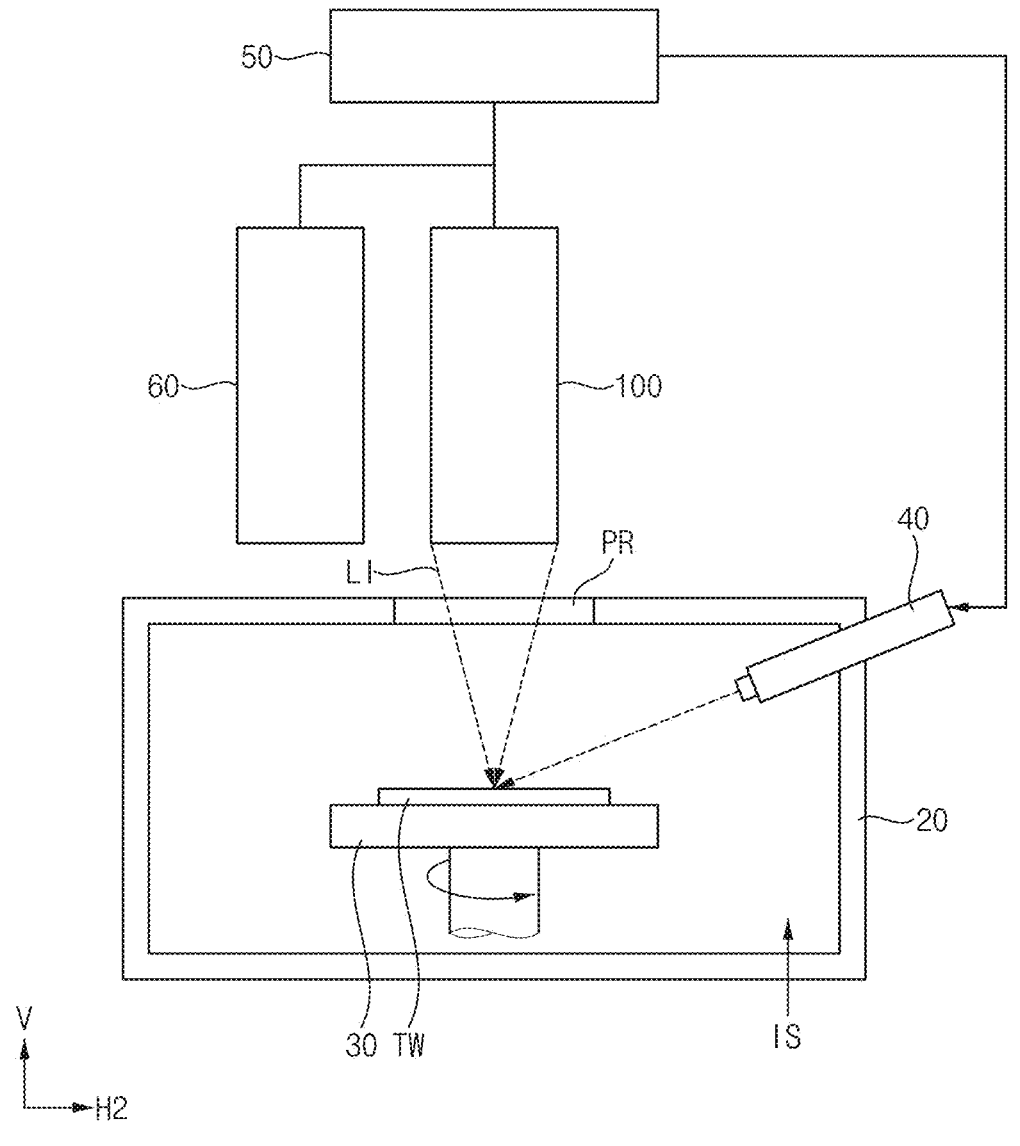
FIG. 8 is a view illustrating an incident light from the measuring device of FIG. 4 being emitted onto the test wafer.
Figure 9:
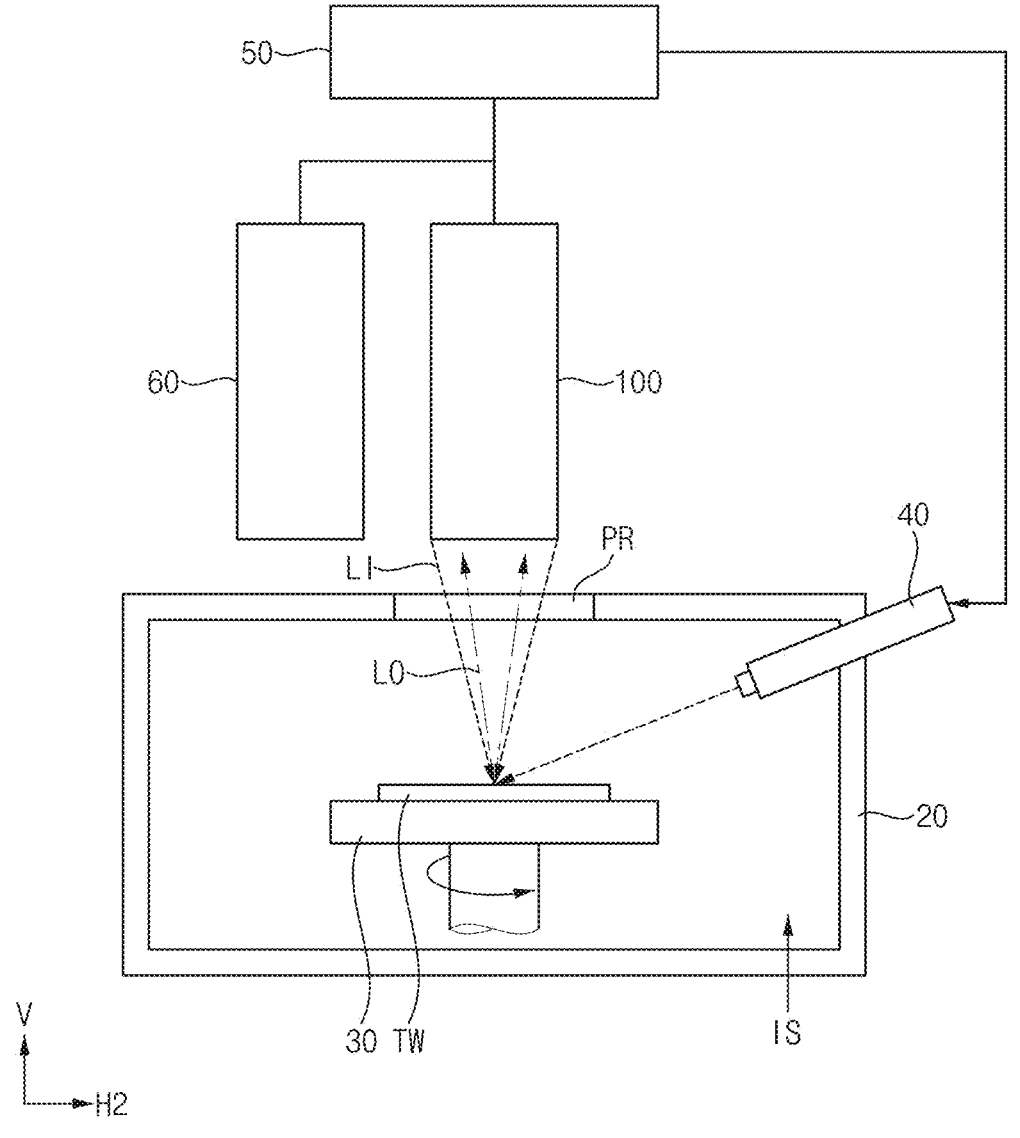
FIG. 9 is a view illustrating a reflected light reflected by the test wafer being returned to the measuring device of FIG. 4.
Figure 10:
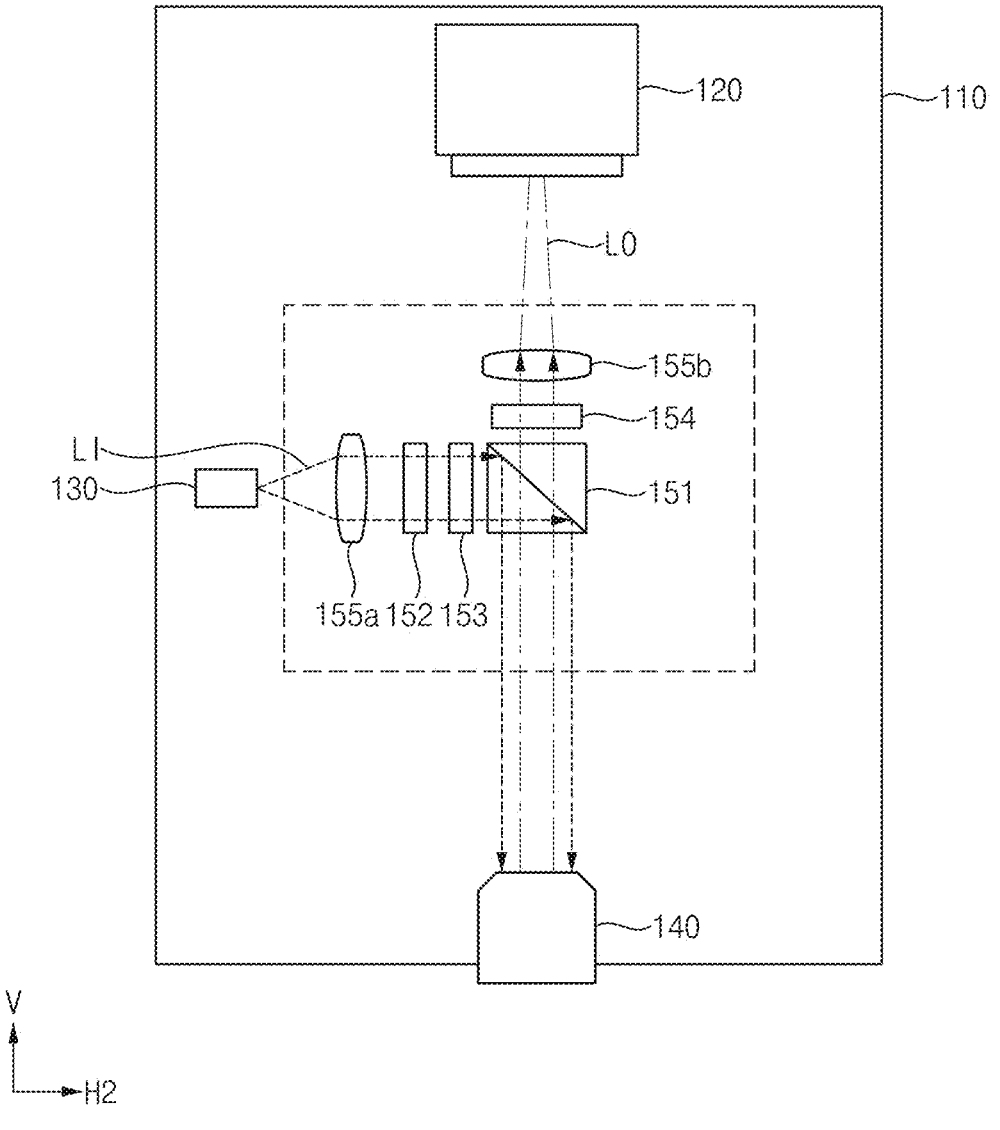
FIG. 10 is a view illustrating the reflected light of FIG. 9 being introduced into the polarization camera.
Figure 11:
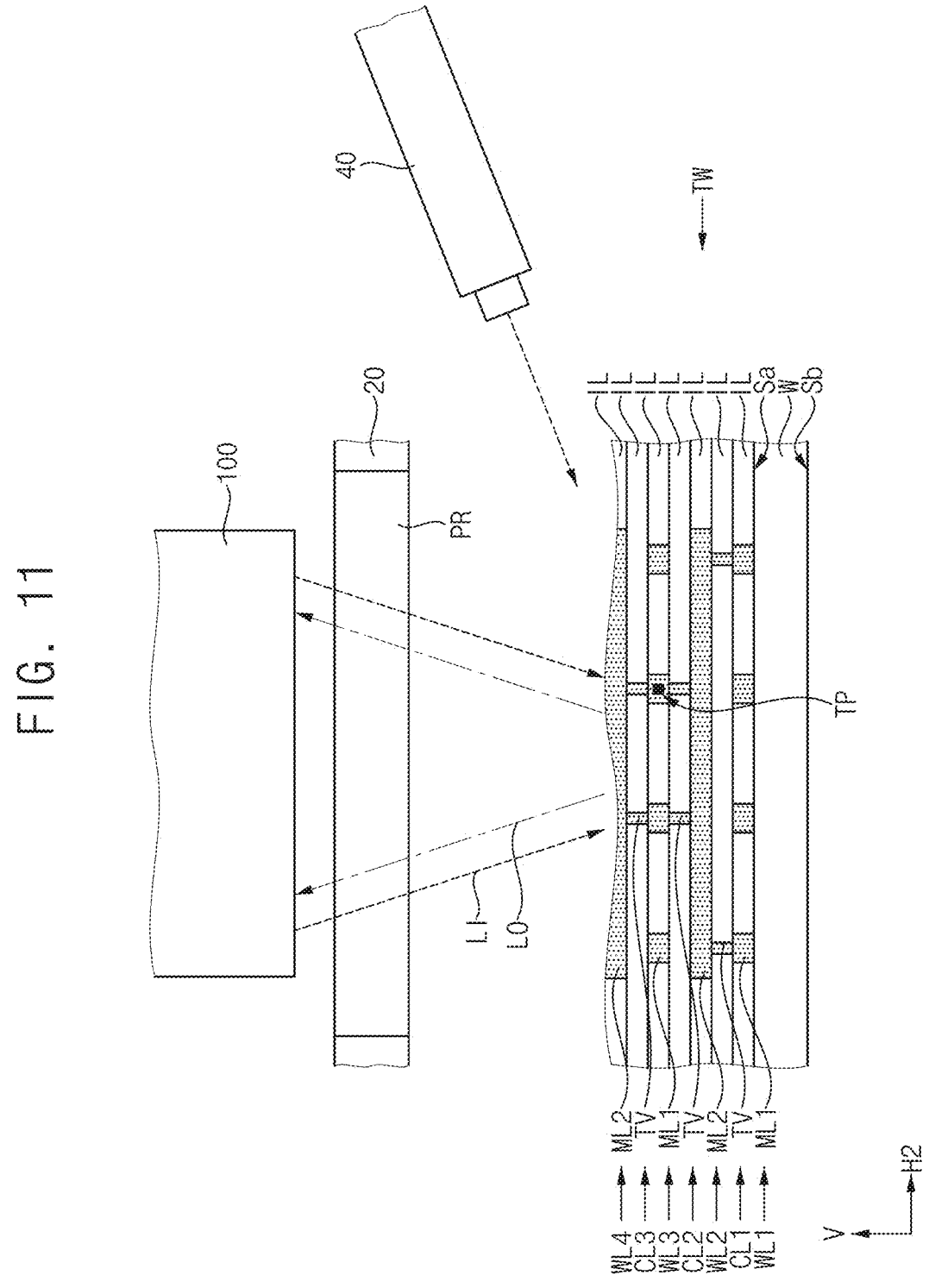
FIGS. 11 and 12 are views illustrating a wiring layer being measured with the measuring device of FIG. 4 in accordance with one or more embodiments.
Figure 12:
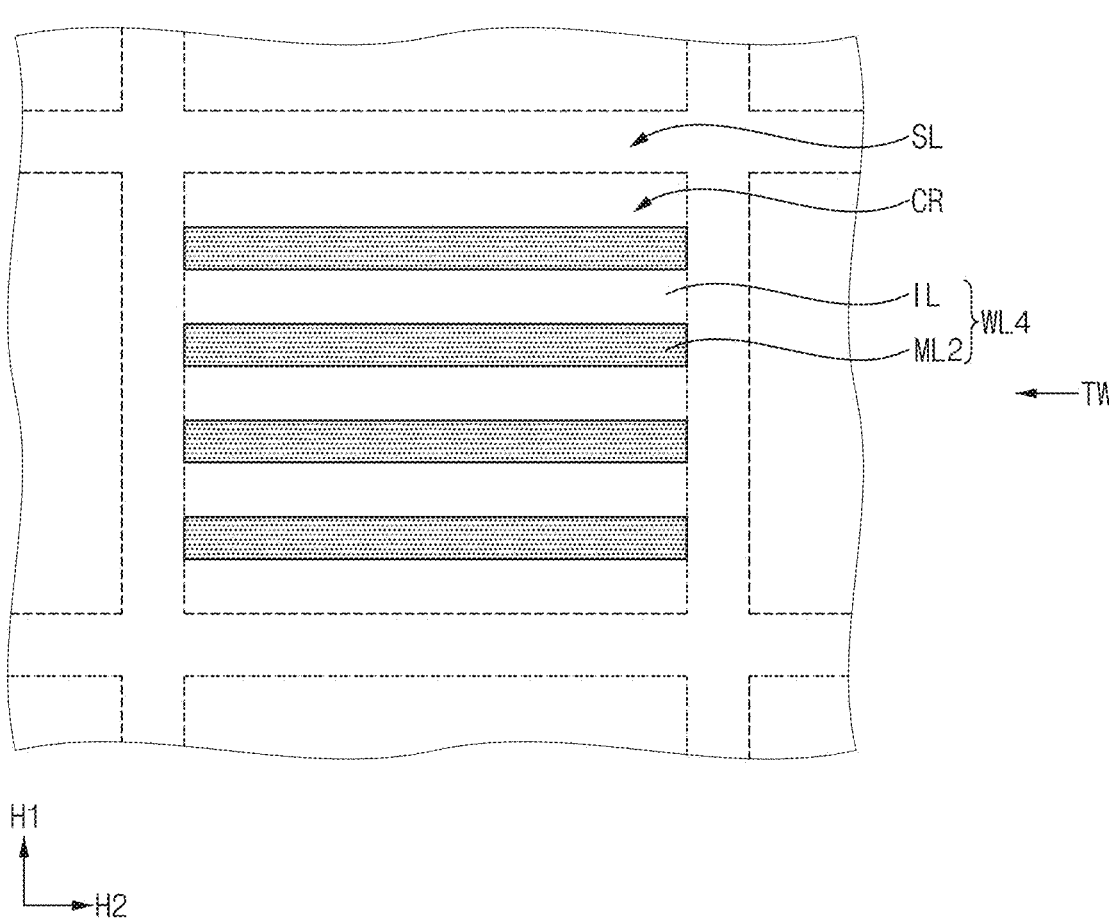
Figure 14:
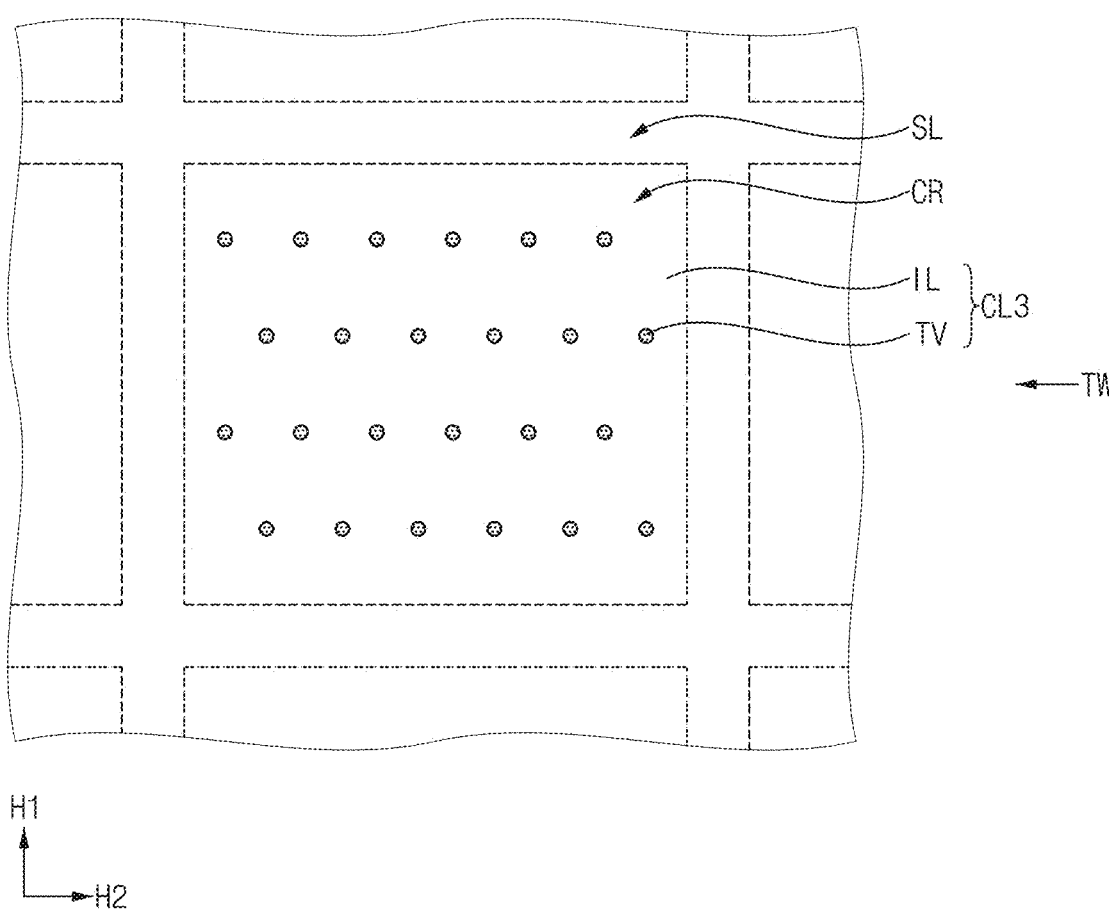
Figure 16:
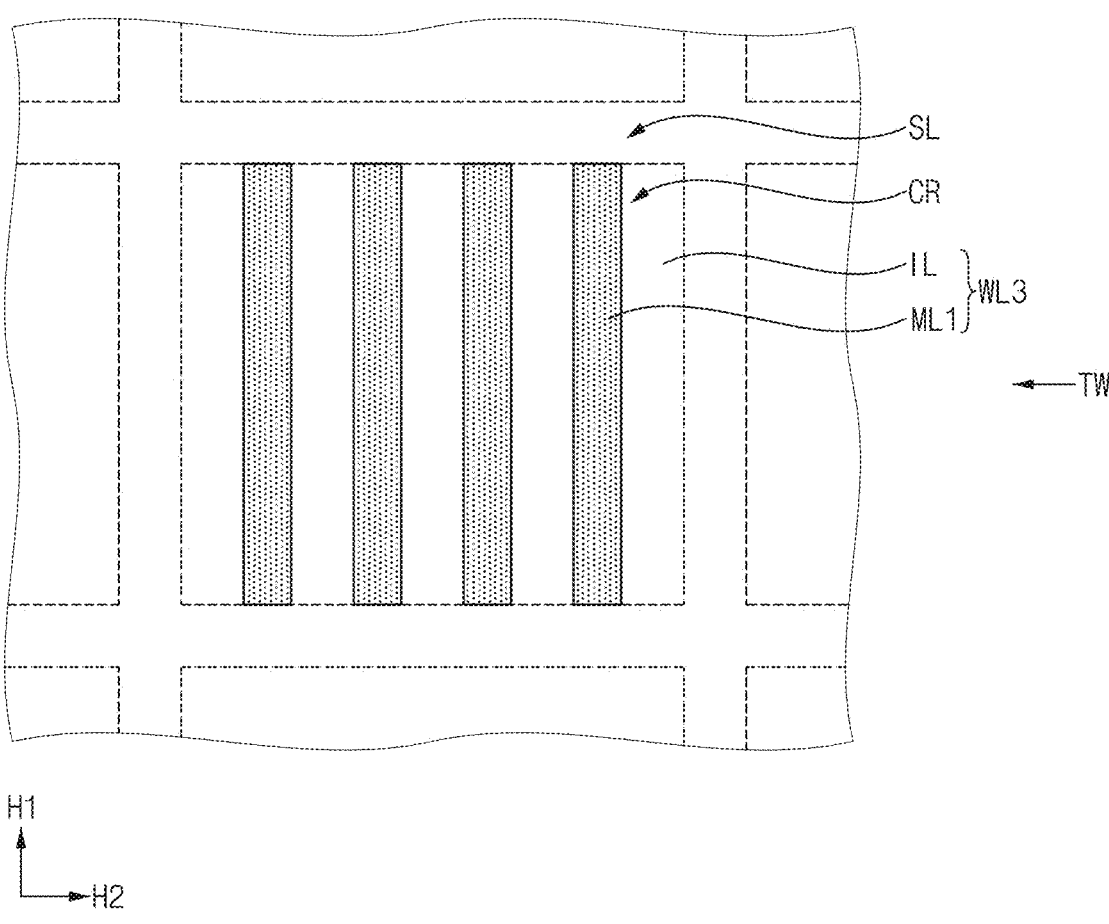
Figure 17:
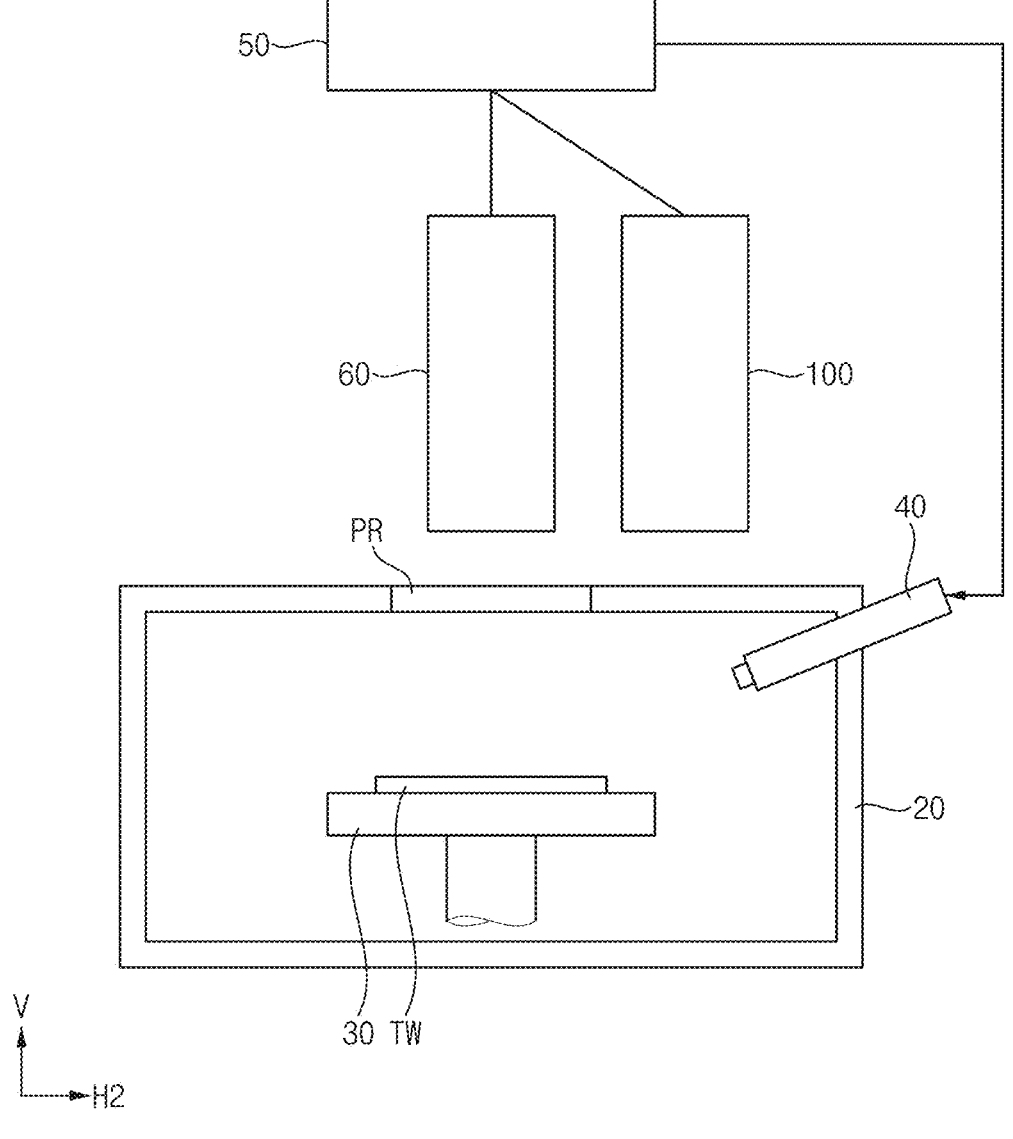
FIG. 17 is a view illustrating scanning the test wafer by using the image measurement apparatus of FIG. 4.
Figure 18:
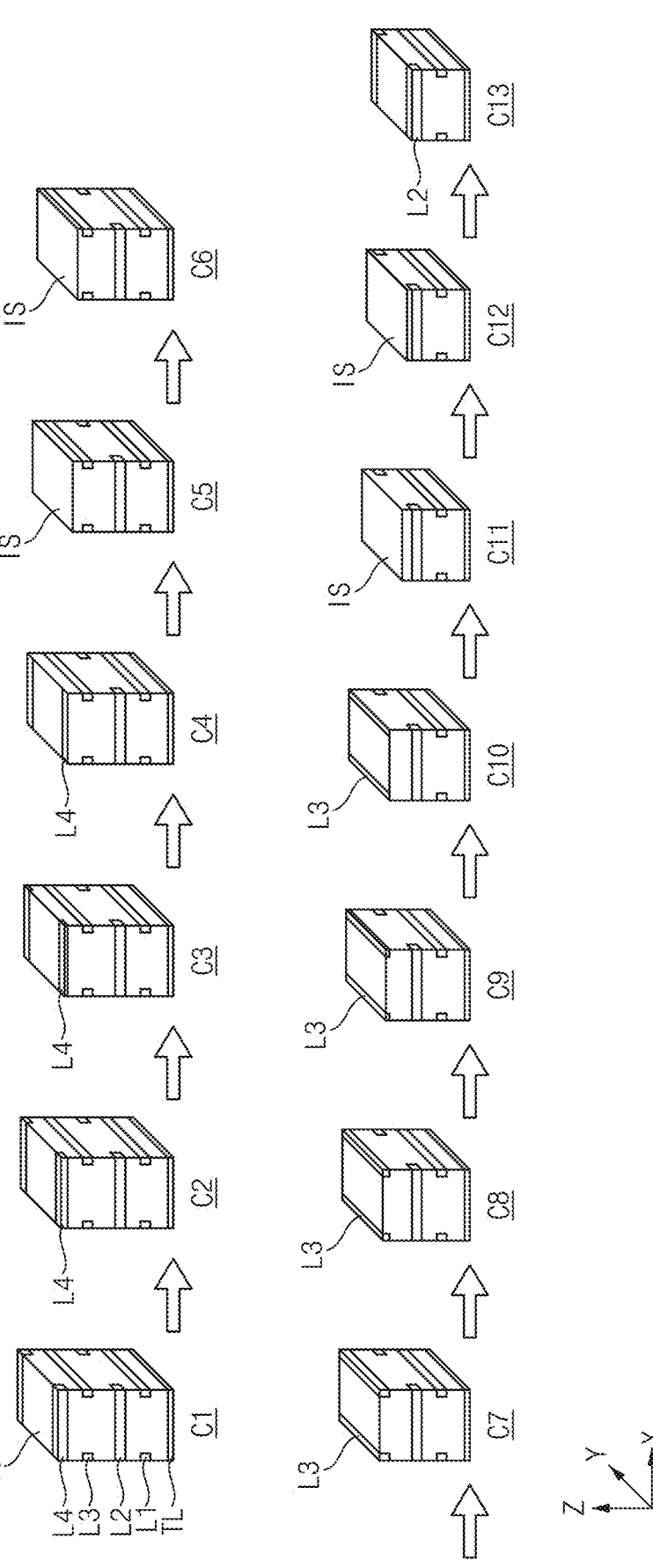
FIG. 18 is a view illustrating sequentially etching a plurality of wiring layers of a semiconductor unit in accordance with one or more embodiments.
Figure 19B:
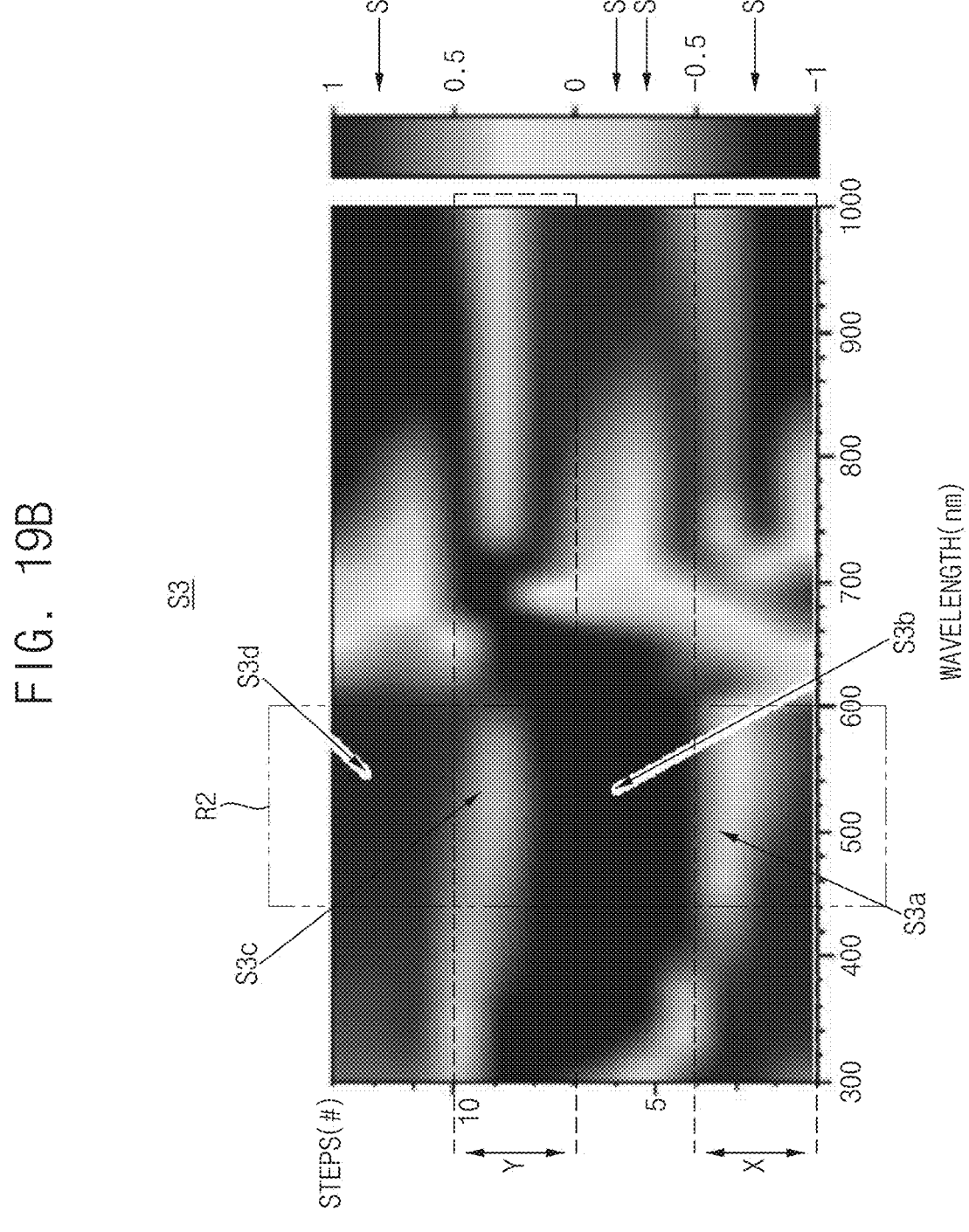
FIG. 19B is a simulation graph illustrating a change of a fourth polarization variable according to the etch simulation of FIG. 18.
Figure 20A:
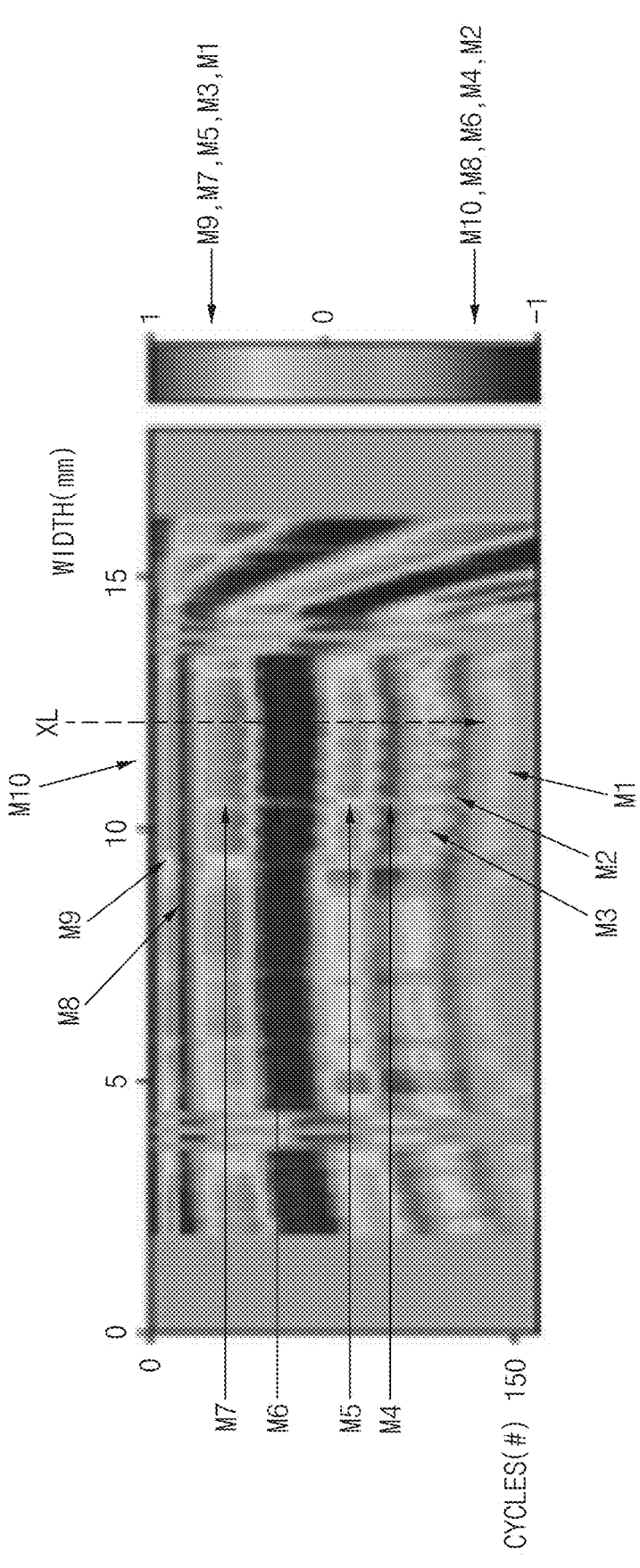
FIG. 20A is an experimental graph illustrating a change of a fourth polarization variable measured on a sample.

FIG. 3 is a flow diagram illustrating a method of inspecting a semiconductor device in accordance with one or more embodiments. FIG. 4 is a view illustrating a test wafer being etched, wherein the test wafer is loaded on an inspecting apparatus in accordance with one or more embodiments. FIG. 5 is an enlarged cross-sectional view illustrating the test wafer of FIG. 4. FIG. 6 is a plan view illustrating a wiring layer of the test wafer of FIG. 4. FIG. 7 is a view illustrating light being irradiated (emitted) from a light source in the measuring device of FIG. 4. FIG. 8 is a view illustrating an incident light from the measuring device of FIG. 4 being irradiated (emitted) onto the test wafer. FIG. 9 is a view illustrating a reflected light reflected by the test wafer being returned to the measuring device of FIG. 4. FIG. 10 is a view illustrating the reflected light of FIG. 9 being introduced into the polarization camera. FIGS. 11 and 12 are views illustrating a wiring layer, which includes a plurality of second metal lines, being measured with the measuring device of FIG. 4. FIGS. 13 and 14 are views illustrating an insulation layer, which includes a plurality of vias, being measured with the measuring device of FIG. 4. FIGS. 15 and 16 are views illustrating a wiring layer, which includes a plurality of first metal lines being measured with the measuring device of FIG. 4. FIG. 17 is a view illustrating scanning the test wafer by using the image measurement apparatus of FIG. 4. FIG. 18 is a view illustrating sequentially etching a plurality of wiring layers of a semiconductor unit, wherein the semiconductor unit is a target of simulation. FIG. 19A is a simulation graph illustrating a change of a second polarization variable according to the etching simulation of FIG. 18. FIG. 19B is a simulation graph illustrating a change of a fourth polarization variable according to the etch simulation of FIG. 18. FIG. 20A is an experimental graph illustrating a change of a fourth polarization variable measured on a sample. FIG. 20B is an experimental graph illustrating a value of the fourth polarization variable changing periodically relative to the specific location in the experimental graph of FIG. 20A.

FIG. 3 illustrates a flowchart of a method of inspecting a semiconductor device using the inspecting apparatus 10 in accordance with one or more embodiments.

First, before inspecting the semiconductor device using the inspecting apparatus 10 in accordance with the one or more embodiments, an electrical inspection may be performed to determine whether a defect has occurred in the semiconductor device and an approximate location where the defect has occurred (S10).

The inspecting apparatus 10 including a measuring device 100 may be provided (S20), and a test wafer TW, which is a sample, may be loaded onto the inspecting apparatus 10 (S30).

By using a milling device 40 of the inspecting apparatus 10, a milling process may be performed in order to partially remove the test wafer TW (S110).

During the milling process, the etched surface of the test wafer TW, on which the milling process is performed, may be measured by the measuring device 100 (S121).

By using the measuring device 100, uniformity data of the etched surface may be obtained (S123), and feedback may be performed by reflecting the uniformity data (S125).

Further, an end point may be detected by using the measuring device 100 (S127).

When the end point is reached, the milling process may be stopped (S130). However, embodiments are not limited thereto, and for example, when the end point has not been reached, the milling process and the measurement may continue.

Thereafter, a horizontal image of the wiring layer including a defect may be scanned by an image measuring device 60 of the inspecting apparatus 10 (S140). For example, the image measuring device may include a scanning electron microscope (SEM) or a transmission electron microscope (TEM).

The defect data may be obtained from the horizontal image (S150). However, embodiments are not limited thereto, and for example, when the defect is not identified in the horizontal image, the milling process and the image scanning may be repeated by using the inspecting apparatus 10.

Referring to FIGS. 4 to 6, an inspecting apparatus 10 for semiconductor device having a measuring device 100 may be provided, a test wafer TW may be loaded on a substrate stage 30 of the inspecting apparatus 10 for semiconductor device, and the test wafer TW may be etched by using a milling device 40 of the inspecting apparatus 10 for semiconductor device.

Since the inspecting apparatus for semiconductor device is substantially the same as the inspecting apparatus 10 for semiconductor device in accordance with the one or more embodiments described in FIGS. 1 and 2, repeated description of the same components will be omitted.

The substrate stage 30 may be rotated at a constant speed by a driving portion, so as to integrally rotate the test wafer TW provided on an upper portion of the substrate stage. The milling device 40 may irradiate (emit) an ion beam onto the rotating test wafer, thereby partially removing the rotating test wafer. For example, the ion beam may be argon (Ar) ions. Thus, the etching process may proceed uniformly with respect to the etched surface ES of the test wafer compared to case that the etching process is performed with the test wafer TW stationary.

The test wafer TW may include a device layer W, on which a plurality of electronic elements are formed, and a plurality of wiring layers BL electrically connected with the plurality of electronic elements. For example, the plurality of electronic elements may be a plurality of transistors. Each of the plurality of wiring layers BL may include a plurality of metal lines ML1 and ML2 formed by a back end of line (BEOL) process and an insulation layer IL covering the plurality of metal lines ML1 and ML2. Further, the plurality of metal lines ML1 and ML2 provided in each of the plurality of wiring layers BL may be connected by a plurality of vias TV. For example, the plurality of metal lines ML1 and ML2 and the plurality of vias TV may include a conductive material such as, for example, aluminum (Al), copper (Cu), etc.

The plurality of metal lines ML1 and ML2 may include a plurality of first metal lines ML1 extending in a first horizontal direction (H1 direction) and a plurality of second metal lines ML2 extending in a second horizontal direction (H2 direction) perpendicular to the first horizontal direction (H1 direction). The plurality of first metal lines ML1 and the plurality of second metal lines ML2 may be alternately stacked on a front surface as active surface S1 of the device layer W. Further, a plurality of vias TV may be provided between the plurality of first metal lines ML1 and the plurality of second metal lines ML2.

While the figures illustrate a plurality of wiring layers having a first to tenth wiring layer (WL1, WL2, WL3, WL4, WL5, WL6, WL7, WL8, WL9, WL10) and a first to ninth connecting layer (CL1, CL2, CL3, CL4, CL5, CL6, CL7, CL8, CL9), embodiments are not limited thereto. Accordingly, the size of the test wafer TW, thickness of the test wafer TW, number of the plurality of wiring layers, etc. may be varied.

Referring to FIGS. 7 to 10, the measuring device 100 may be used to irradiate (emit) incident light LI onto the test wafer TW during an etch process, and reflected light LO reflected by the test wafer TW may be returned by the measurement apparatus 100 to measure a horizontal image of the test wafer TW and a polarization characteristic of the reflected light LO.

The incident light LI may generate from the light source 130 and be guided to the objective lens 140 through the lens assembly 150. For example, the incident light LI may pass through a first optical filter 152 and a second optical filter 153, and then be rerouted by an optical splitter 151 to guide the incident light LI to the objective lens 140.

The incident light LI may pass through the objective lens 140 and the passing region PR of the chamber 20 to be irradiated (emitted) onto the test wafer TW. The incident light LI may be reflected by a plurality of wiring layers provided on the test wafer TW. In this case, polarization characteristics of the incident light LI may change depending on an extension direction of the plurality of metal lines provided inside the wiring layers.

A reflected light LO reflected by the plurality of wiring layers may be returned to the measuring device 100. The reflected light LO may be introduced into the polarization camera 120 via the objective lens 140, the optical splitter 151 and the wave plate 154. The wave plate 154 may be configured to induce a time delay between the polarization components to assist in determining a circular polarization component of the reflected light (LO) through the polarization camera 120. The polarization camera may measure a horizontal image of the etched surface and the polarization characteristics of the reflected light from the reflected light.

Referring to FIGS. 11 and 12, light may be irradiated (emitted) on a fourth wiring layer WL4 including the plurality of second metal lines ML2 to measure the polarization characteristics of the reflected light LO reflected by the fourth wiring layer WL4. The controller 50 may detect that an uppermost wiring layer of the test wafer TW is the fourth wiring layer WL4 by identifying a change in the polarization characteristics. Furthermore, the horizontal image of the test wafer TW may be measured, and the controller 50 may adjust the intensity distribution of an ion beam irradiated (emitted) by the milling device 40 based on a measurement results.

A second polarization component parallel to the second direction (H2 direction) of the incident light LI may be reflected by the plurality of second metal lines ML2 of the fourth wiring layer WL4, and a first polarization component perpendicular to the second direction (H2 direction) of the incident light LI may be transmitted. The transmitted first polarization component may be reflected by the plurality of first metal lines ML1 of the third wiring layer WL3 including the plurality of first metal lines ML1.

Thus, the second polarization component and the first polarization component may have differences in vibration direction and phase. From the reflected light LO, the polarization camera 120 may measure the polarization characteristics of the reflected light LO including the difference in the vibration direction and the difference in the phase. The controller 50 may determine a progress of the etching process by identifying changes in the polarization characteristics of the reflected light LO based on the polarization characteristics.

Referring to FIGS. 13 and 14, the polarization characteristics of the reflected light LO reflected by a third connecting layer CL3 including a plurality of vias TV may be measured by irradiating (emitting) light on the third connecting layer CL3. The controller 50 may detect that the uppermost wiring layer of the test wafer TW is the third connecting layer CL3 based on a change in the polarization characteristics. Furthermore, a horizontal image of the test wafer TW may be measured, and the controller 50 may adjust the intensity distribution of the ion beam irradiated (emitted) by the milling device 40 based on the measurement results.

Each of the plurality of vias TV may have, for example, a circular shape. Thus, the plurality of vias may have a relatively small effect on the polarization characteristics of the incident light.

Referring to FIGS. 15 and 16, the polarization characteristics of the reflected light LO reflected by a third wiring layer WL3 including the plurality of first metal lines ML1 may be measured by irradiating light onto the third wiring layer WL3. The controller 50 may detect that the etching process has reached an end point by identifying a change in the polarization characteristic. Furthermore, a horizontal image of the test wafer TW may be measured, and the controller 50 may adjust the intensity distribution of the ion beam irradiated (emitted) by the milling device 40 based on the measurement results.

The end point may be a stop point of the etching process at which the etching process reaches a target wiring layer to be exposed by removing upper wiring layers on the target wiring layer. For example, the target wiring layer may be determined by identifying whether a defect has occurred and an approximate location of a defect through an electrical test. For example, an uppermost wiring layer of the approximate defect point may be set as a target point TP.

The first polarization component parallel to the first direction (H1 direction) among the incident light LI may be reflected by the plurality of first metal lines ML1 of the third wiring layer WL3, and the second polarization component perpendicular to the first direction (H1 direction) among the incident light LI may be transmitted. The transmitted second polarization component may be reflected by the plurality of second metal lines ML2 of the second wiring layer WL2 including the plurality of second metal lines ML2.

Thus, the second polarization component and the first polarization component may have differences in vibration direction and phase. The polarization camera 120 may measure the polarization characteristics of the reflected light LO, including the difference in the vibration direction and the difference in the phase, from the reflected light LO. The controller 50 may identify a change in the polarization characteristics of the reflected light LO based on the polarization characteristics to determine that the etching process has reached the end point.

Referring to FIG. 17, after reaching the end point, the milling device 40 may be stopped through the controller 50. Then, a horizontal image of the third wiring layer WL3 including the target point TP may be scanned through the image measuring device 60 to check the defect. For example, the image measuring device may be a scanning electron microscope (SEM) or a transmission electron microscope (TEM).

In the case that the defect is not identified by the horizontal image, the etching process may be performed again. For example, the etching process may proceed until the second wiring layer WL2 is exposed. At this time, as described above, the end point of the etching process may be detected using the measuring device 100. In addition, the measuring device 100 may be used to measure the uniformity of the etched surface during the etching process, and feedback may be provided in real time via the controller 50. Then, a horizontal image of the second wiring layer WL2 may be scanned by the image measuring device 60 to check defects.

FIG. 18 illustrates that when a plurality of wiring layers of the semiconductor unit are etched sequentially, the polarization characteristics of the reflected light reflected by the wiring layer may change depending on the direction of extension of the wiring layer. The semiconductor unit may be an object for simulation, wherein the semiconductor unit is the smallest unit capable of representing the polarization characteristics of the test wafer TW.

The plurality of wiring layers of the semiconductor unit may be etched sequentially over a plurality of steps.

For example, a device layer TL may be provided on a lowermost portion of the semiconductor unit. A first to fourth wiring layers L1, L2, L3 and L4 may be sequentially stacked on the device layer. The first to fourth wiring layers L1, L2, L3 and L4 may be connected to each other through a plurality of vias. A first to fourth steps C1, C2, C3 and C4 may be steps in which the fourth wiring layer as uppermost wiring layer L4 is removed. A fifth and sixth steps C5 and C6 may be steps in which a plurality of vias and an insulation layer IS, which are provided between the fourth wiring layer L4 and the third wiring layer L3, are removed. A seventh to tenth steps C7, C8, C9 and C10 may be steps in which the third wiring layer L3 is removed. The eleventh and twelfth steps C11 and C12 may be steps in which a plurality of vias and an insulation layer IS, which are provided between the third wiring layer L3 and the second wiring layer L2, are removed. The thirteenth step C13 may be a step where the second wiring layer L2 begins to be removed.

A direction, in which the first wiring layer L1 and the third wiring layer L3 extend, may be in the "Y direction". A direction, in which the second wiring layer L2 and the fourth wiring layer L4 extend, may be in the "X direction". A direction, in which the first to fourth wiring layers L1, L2, L3 and L4 are stacked, may be the "Z direction". The "X direction", the "Y direction", and the "Z direction" may be perpendicular to each other.

FIGS. 19A and 19B illustrate that the polarization characteristics of the reflected light may change as the wiring layer is removed. In the graphs of FIGS. 19A and 19B, the horizontal axis may be a wavelength of the irradiated (emitted) light, and the vertical axis may be the plurality of steps C1, C2, C3, C4, C5, C6, C7, C8, C9, C10, C11, C12 and C13 in FIG. 18.

For example, the polarization characteristics may be represented by a stokes parameter. The stokes parameter may include first to fourth polarization variables S0, S1, S2 and S3. The first polarization variable S0 may be a value obtained by adding a magnitude of the first polarization component I0 vibrating along the X direction to a magnitude of the second polarization component I90 vibrating along the Y direction. The second polarization variable S1 may be a value obtained by subtracting the magnitude of the second polarization component I90 oscillating in the Y direction from the magnitude of the first polarization component I0 vibrating in the X direction. The third polarization variable S2 may be a value obtained by subtracting a magnitude of the fourth polarization component I135 vibrating in a direction tilted by 135 degrees counterclockwise with respect to the X direction from a magnitude of the third polarization component I45 vibrating in a direction tilted by 45 degrees counterclockwise with respect to the X direction. The fourth polarization variable S3 may be a value of a magnitude of the fifth polarization component IR, which represents right circular polarization, minus the magnitude of the sixth polarization component IL, which represents left circular polarization. The right circular polarization may be a polarization state in which a vibrational direction of the light is rotated counterclockwise when a phase of a X-direction component of the light is '90 degrees' ahead of a phase of a Y-direction component of the light. The left circular polarization may be a polarization state in which a vibrational direction of the light rotates clockwise when a phase of a Y-direction component of the light is '90 degrees' ahead of a phase of a X-direction component of the light.

Referring again to FIG. 19A, changes in the second polarization variable S1 can be seen.

For example, from a change of the second polarization variable S1 in a first wavelength region R1, a value of the second polarization variable S1 changes as the direction of extension of the uppermost wiring layer changes. For example, a wavelength of the light in the first wavelength region may be in the range of 450 nm to 600 nm.

In the first to fourth stages C1, C2, C3 and C4, the fourth wiring layer as uppermost wiring layer L4 may extend in the X direction (see FIG. 18). In this case, the second polarization variable S1 in the first wavelength region R1 may have a first magnitude S1a. For example, the first magnitude may be in the range of −1 to −0.5.

In the fifth and sixth step C5 and C6, the insulation layer IS may be provided on an uppermost portion (see FIG. 18). In this case, the second polarization variable S1 in the first wavelength region R1 may have a second magnitude S1b. For example, the second magnitude may be in the range of from 0 to 0.5.

In the seventh to tenth steps C7, C8, C9 and C10, the third wiring layer as uppermost wiring layer L3 may extend in the Y direction (see FIG. 18). In this case, the second polarization variable S1 in the first wavelength region R1 may have a third magnitude S1c. For example, the third magnitude may be in the range of 0.5 to 1.

In the eleventh and twelfth steps C11 and C12, the insulation layer IS may be provided on an uppermost portion (see FIG. 18). In this case, the second polarization variable S1 in the first wavelength region R1 may have a fourth magnitude S1d. For example, the fourth magnitude may be in the range of 0 to 0.5.

Thus, when the etching process proceeds, the magnitude of the second polarization variable S1 sequentially increases and decreases depending on the extension direction and configuration of the wiring layer. Accordingly, by measuring a change of the magnitude of the second polarization variable, a wiring layer in which the etching process is in progress may be identified.

Referring again to FIG. 19B, changes in the fourth polarization variable S3 can be seen.

For example, from a change of the fourth polarization variable S4 in the second wavelength region R2, it can be seen that a value of the fourth polarization variable S4 changes as the direction of extension of the uppermost wiring layer changes. For example, a wavelength of the light in the second wavelength region may be in the range of 450 nm to 600 nm.

In the first to fourth steps C1, C2, C3 and C4, the fourth wiring layer as uppermost wiring layer L4 may extend in the X direction (see FIG. 18). In this case, the fourth polarization variable S4 in the second wavelength region R2 may have a fifth magnitude S3a. For example, the fifth magnitude may be in the range of 0 to −0.5.

In the fifth and sixth step C5 and C6, the insulation layer IS may be provided on an uppermost portion (see FIG. 18). In this case, the fourth polarization variable S4 in the second wavelength region R2 may have a sixth magnitude S3b. For example, the sixth magnitude may be in the range of −0.5 to −1.

In the seventh and tenth steps C7, C8, C9 and C10, the third wiring layer as uppermost wiring layer L3 may extend in the Y direction (see FIG. 18). In this case, the fourth polarization variable S4 in the second wavelength region R2 may have a seventh magnitude S3c. For example, the seventh magnitude may be in a range of 0 to 0.5.

In the eleventh and twelfth steps C11 and C12, the insulation layer IS may be provided on an uppermost portion (see FIG. 18). In this case, the fourth polarization variable S3 in the second wavelength region R1 may have an eighth magnitude S3d. For example, the eighth magnitude may be in the range of 0.5 to 1.

Thus, when the etching process proceeds, the magnitude of the fourth polarization variable S4 sequentially increases and decreases depending on the extension direction and configuration of the wiring layer. Accordingly, by measuring the change of the magnitude of the fourth polarization variable, the wiring layer on which the etching process is being performed may be identified.

Referring to FIGS. 20A and 20B, a polarization variable of the reflected light measured by the polarization camera 120 changes regularly. Thus, by measuring a change in the polarization variable of the reflected light, a progress of the etching process may be determined and the end point can be detected. A horizontal axis of a graph in FIG. 20A may represent a size in one direction of a sample subject to the experiment. The sample may be a semiconductor device including a plurality of wiring layers. A vertical axis of the graph in FIG. 20A may represent a passage of time over which the etching process proceeds. A horizontal axis of a graph in FIG. 20(b) may be the same as the vertical axis of the graph in FIG. 20A. A vertical axis of the graph in FIG. 20(b) may represent a value of a polarization variable that varies at a specific location fixed on the horizontal axis of the graph in FIG. 20A. The polarization variable may be the fourth polarization variable S3 described with reference to FIG. 18.

Referring again to FIG. 20A, the magnitude of the third polarization variable S3 may increase and decrease repeatedly as a plurality of wiring layers are etched by the etching process.

For example, the third polarization variable S3 may be sequentially increased and decreased at a specific location XL of the sample. When a tenth test wiring layer M10 is irradiated (emitted) with light, a value of the third polarization variable S3 may be in the range of −1 to 0. The same may be the case when light is irradiated (emitted) on an eighth test wiring layer M8, a sixth test wiring layer M6, a fourth test wiring layer M4, and a second test wiring layer M2. Also, when a ninth test wiring layer M9 is irradiated (emitted) with light, a value of the third polarization variable S3 may be in a range of 0 to 1. The same may be the case when light is irradiated (emitted) to a seventh test wiring layer M7, a fifth test wiring layer M5, a third test wiring layer M3, and a first test wiring layer M1.

Therefore, as the etching process proceeds sequentially from the tenth test wiring layer M10 to the first test wiring layer M1, the value of the third polarization variable S3 may change by alternating between negative and positive values.

Referring again to FIG. 20B, the magnitude of the third polarization variable s3 alternatively has peaks and troughs as the etching process progresses. For example, the peaks may be points where the value of the third polarization variable S3 increases and then decreases, and the troughs may be points where the value of the third polarization variable S3 decreases and then increases.

The peaks and the troughs may change depending on the direction of extension of the wiring layer in which the etching process is performed. Therefore, by determining a number of changes of the peaks and the troughs, the wiring layer in which the etching process is performed and the end point may be detected.

As described above, in the method of inspecting a semiconductor device in accordance with one or more embodiments, the inspecting apparatus 10 for semiconductor device including the measuring device 100 may be provided. The test wafer TW may be loaded onto the substrate stage 30 of the inspecting apparatus 10 for semiconductor device. The test wafer TW may be irradiated (emitted) with an ion beam from the milling device 40 to partially remove the plurality of wiring layers of the test wafer TW. By using the measuring device 100, the horizontal image of the wiring layer, which is etched, and the polarization characteristic of the reflected light reflected by the test wafer TW may be measured.

The controller 50 of the inspecting apparatus 10 for the semiconductor device may determine the uniformity of the wiring layer, which is etched, based on the horizontal image and adjust the intensity distribution of the ion beam irradiated (emitted) by the milling device 40 by reflecting the uniformity. Furthermore, the controller 50 of the inspecting apparatus 10 for semiconductor device may detect the end point from the polarization characteristics of the reflected light in order to stop an operation of the milling device 40 at the end point.

Accordingly, the method of inspecting semiconductor device may obtain the horizontal image data of the wiring layer and may etch the wiring layer uniformly by reflecting the horizontal image data. Furthermore, the method of inspecting semiconductor device may detect the end point of the etching process, thereby reducing the process time.

At least one of the components, elements, modules or units (collectively "components" in this paragraph) represented by a block in the drawings, such as the controller 50 in FIG. 1, may be embodied as various numbers of hardware, software and/or firmware structures that execute respective functions described above, according to an exemplary embodiment. For example, at least one of these components may use a direct circuit structure, such as a memory, a processor, a logic circuit, a look-up table, etc. that may execute the respective functions through controls of one or more microprocessors or other control apparatuses. Also, at least one of these components may be specifically embodied by a module, a program, or a part of code, which contains one or more executable instructions for performing specified logic functions, and executed by one or more microprocessors or other control apparatuses. Further, at least one of these components may include or may be implemented by a processor such as a central processing unit (CPU) that performs the respective functions, a microprocessor, or the like. Two or more of these components may be combined into one single component which performs all operations or functions of the combined two or more components. Also, at least part of functions of at least one of these components may be performed by another of these components. Further, although a bus is not illustrated in the above block diagrams, communication between the components may be performed through the bus. Functional aspects of the above exemplary embodiments may be implemented in algorithms that execute on one or more processors. Furthermore, the components represented by a block or processing steps may employ any number of related art techniques for electronics configuration, signal processing and/or control, data processing and the like.

While embodiments have been described with reference to the figures, it will be understood by those of ordinary skill in the art that various changes in form and details may be made therein without departing from the spirit and scope as defined by the following claims and their equivalents.

What is claimed is:

1. An inspecting apparatus for semiconductor device comprising:
   a chamber comprising a passing region configured to transmit light;
   a substrate stage included in the chamber and comprising a seated surface configured to load a test wafer, the test wafer comprising a plurality of wiring layers respectively comprising a plurality of metal lines;
   a milling device configured to emit an ion-beam on the plurality of wiring layers included in the test wafer to partially remove the test wafer; and
   a measuring device comprising:

17 a body portion on the passing region and comprising a first end portion facing the passing region;

a light source on a side portion of the body portion and configured to emit incident light;

an objective lens provided on the first end portion of the body portion;

a lens assembly comprising a plurality of optical filters and an optical splitter, the lens assembly being configured to introduce the incident light such that the incident light passes through the objective lens and the passing region and is emitted on the test wafer; and a polarization camera configured to scan the test wafer based on receiving reflected light reflected from the test wafer, wherein the measuring device is configured to measure a polarization characteristic of the reflected light and uniformity of the test wafer.

2. The inspecting apparatus of claim 1, further comprising:

at least one processor configured to detect an end point of a milling process based on the measured polarization characteristic and stop an operation of the milling device at the detected end point.

3. The inspecting apparatus of claim 2, wherein the at least one processor is configured to control an intensity distribution of the ion-beam emitted from the milling device by reflecting the measured uniformity of the test wafer.

4. The inspecting apparatus of claim 1, further comprising:

an image measuring device configured to measure an image of the test wafer by emitting an electronic beam on the test wafer that is etched by the milling device.

5. The inspecting apparatus of claim 1, wherein the plurality of optical filters included in the lens assembly comprise:

a bandwidth filter configured to selectively transmit light having a predetermined wavelength from the incident light; and a polarization filter configured to adjust a polarization characteristic of the incident light.

6. The inspecting apparatus of claim 1, wherein the lens assembly comprises a wave plate between the optical splitter and the polarization camera, the wave plate being configured to delay a portion of polarization components of the reflected light.

7. The inspecting apparatus of claim 1, wherein the polarization characteristic changes periodically based on an extension direction of the plurality of metal lines.

8. The inspecting apparatus of claim 7, wherein the plurality of metal lines comprise a plurality of first metal lines extending in a first direction and a plurality of second metal lines extending in a second direction perpendicular to the first direction, wherein a portion of the incident light parallel with the plurality of metal lines is reflected, and wherein a portion of the incident light perpendicular to the plurality of metal lines is penetrated.

9. The inspecting apparatus of claim 1, wherein the substrate stage is configured to rotate to uniformly remove a portion of the test wafer based on the milling device.

10. The inspecting apparatus of claim 9, wherein the polarization camera included in the measuring device is further configured to continuously scan the test wafer based on a rotation cycle of the substrate stage.

11. An inspecting apparatus for semiconductor device comprising:

a chamber an inner space formed by an upper wall comprising a passing region configured to transmit light, a lower wall facing the upper wall, and a plurality of side walls between the upper wall and the lower wall;

a substrate stage included in the inner space and comprising a seated surface configured to load a test wafer, the test wafer comprising a plurality of wiring layers respectively comprising a plurality of metal lines;

a milling device on a portion of the plurality of side walls included in the chamber and configured to emit an ion-beam on the plurality of wiring layers included in the test wafer to partially remove the plurality of wiring layers; and a polarization camera on the passing region and configured to scan the test wafer;

a light source configured to emit incident light to scan the plurality of metal wirings included in the test wafer;

an objective lens between the polarization camera and the light source, and facing the passing region;

a lens assembly between the polarization camera and the objective lens and configured to introduce the incident light such that the incident light passes through the objective lens and the passing region and is emitted on the test wafer; and at least one processor configured to obtain uniformity data of the test wafer and polarization characteristic data of reflected light reflected by the test wafer from the polarization camera.

12. The inspecting apparatus of claim 11, wherein the at least one processor is further configured to detect an end point of a milling process from the measured polarization characteristic and stop an operation of the milling device at the end point.

13. The inspecting apparatus of claim 11, wherein the at least one processor is configured to control an intensity distribution of the ion-beam emitted from the milling device by reflecting the measured uniformity of the test wafer.

14. The inspecting apparatus of claim 11, wherein the lens assembly comprises:

a bandwidth filter configured to selectively transmit light having a predetermined wavelength from the incident light;

a linear polarization filter configured to adjust a polarization characteristic of the incident light; and an optical splitter configured to change a path of the incident light such that the incident light is transmitted to the objective lens and passes the reflected light such that the reflected light is transmitted to the polarization camera.

15. The inspecting apparatus of claim 14, wherein the lens assembly comprises a wave plate between the optical splitter and the polarization camera and configured to delay a portion of polarization components of the reflected light.

16. The inspecting apparatus of claim 11, wherein the polarization characteristic data changes periodically based on an extension direction of the plurality of metal lines.

17. The inspecting apparatus of claim 16, wherein the plurality of metal lines comprise a plurality of first metal lines extending in a first direction and a plurality of second metal lines extending in a second direction perpendicular to the first direction, wherein a portion of the incident light parallel with the plurality of metal lines is reflected, and wherein a portion of the incident light perpendicular to the plurality of metal lines is penetrated.

18. The inspecting apparatus of claim 11, wherein the substrate stage is configured to rotate to uniformly remove a portion of the plurality of metal lines of the test wafer by the milling device.

19. The inspecting apparatus of claim 18, wherein the polarization camera is further configured to continuously scan the test wafer based on a rotation cycle of the substrate stage.

20. An inspecting apparatus for semiconductor device, comprising:

a chamber comprising a passing region and configured to be irradiated by light;

a substrate stage included in the chamber and comprising a seated surface configured to load a test wafer, the test wafer comprising a plurality of wiring layers respectively comprising a plurality of first metal lines extending in a first direction and a plurality of second metal lines extending in a second direction perpendicular to the first direction;

a milling device configured to emit an ion-beam on the plurality of wiring layers to partially remove the plurality of wiring layers;

a measuring device on the passing region and configured to emit incident light on the test wafer which is etched by the ion-beam and measure a polarization characteristic of reflected light reflected from the test wafer; and at least one processor configured to detect an end point of a milling process from the measured polarization characteristic and stop an operation of the milling device at the end point, wherein a first polarization component of the incident light parallel with the first direction is reflected from the plurality of first metal lines, and a second polarization component of incident light perpendicular to the first direction is reflected from the plurality of second metal lines, and wherein the measuring device is configured to detect a difference of vibration direction between the first polarization component and the second polarization component and a difference of phase between the first polarization component and the second polarization component.

* * * * *